United States Patent
Hsu et al.

(10) Patent No.: US 8,765,022 B2
(45) Date of Patent: *Jul. 1, 2014

(54) WATER DISPERSIBLE POLYPYRROLES MADE WITH POLYMERIC ACID COLLOIDS FOR ELECTRONICS APPLICATIONS

(71) Applicant: E I Du Pont De Nemours and Company, Wilmington, DE (US)

(72) Inventors: Che-Hsiung Hsu, Winston-Salem, NC (US); Hjalti Skulason, Buellton, CA (US); Eric Maurice Smith, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/742,556

(22) Filed: Jan. 16, 2013

(65) Prior Publication Data

US 2013/0126790 A1    May 23, 2013

Related U.S. Application Data

(60) Continuation of application No. 12/006,912, filed on Jan. 7, 2008, now abandoned, which is a division of application No. 10/802,341, filed on Mar. 17, 2004, now Pat. No. 7,351,358.

(51) Int. Cl.
| | | |
|---|---|---|
| *H01B 1/12* | (2006.01) | |
| *H01G 11/48* | (2013.01) | |
| *B82Y 10/00* | (2011.01) | |
| *H01G 11/56* | (2013.01) | |
| *C08L 65/00* | (2006.01) | |
| *B82Y 30/00* | (2011.01) | |
| *C08G 61/12* | (2006.01) | |
| *G11C 13/00* | (2006.01) | |

(52) U.S. Cl.
CPC ............... *H01B 1/127* (2013.01); *H01G 11/48* (2013.01); *B82Y 10/00* (2013.01); *H01G 11/56* (2013.01); *C08L 65/00* (2013.01); *Y02E 60/13* (2013.01); *B82Y 30/00* (2013.01); *C08G 61/124* (2013.01); *G11C 13/0016* (2013.01); *G11C 13/0014* (2013.01)
USPC .......................................... 252/500; 528/423

(58) Field of Classification Search
USPC ................... 250/500; 528/422–424
See application file for complete search history.

(56) References Cited

U.S. PATENT DOCUMENTS

| | | | |
|---|---|---|---|
| 3,282,875 A | 11/1966 | Connolly et al. | |
| 3,784,399 A | 1/1974 | Grot | |

(Continued)

FOREIGN PATENT DOCUMENTS

| | | |
|---|---|---|
| CN | 1274869 A | 11/2000 |
| CN | 1276388 A | 12/2000 |

(Continued)

OTHER PUBLICATIONS

Pickup et al "Electronically conducting cation-exchange polymer powders . . . ", Journal of New Materials for Electrochemical Systems, 3, 21-26 (2000).*

(Continued)

*Primary Examiner* — Mark Kopec

(57) ABSTRACT

Compositions are provided comprising aqueous dispersions of at least one polypyrrole and at least one colloid-forming polymeric acid. The colloid-forming polymeric acid may be fluorinated. The new compositions are useful in electronic devices including organic electronic devices such as organic light emitting diode displays, memory storage, electromagnetic shielding, electrochromic displays, and thin film transistors, field effect resistance devices.

15 Claims, 1 Drawing Sheet

(56) References Cited

U.S. PATENT DOCUMENTS

| | | | |
|---|---|---|---|
| 3,849,458 A | 11/1974 | Dinh | |
| 4,321,114 A | 3/1982 | MacDiarmid et al. | |
| 4,356,429 A | 10/1982 | Tang | |
| 4,358,545 A | 11/1982 | Ezzell et al. | |
| 4,433,082 A | 2/1984 | Grot et al. | |
| 4,442,187 A | 4/1984 | MacDiarmid et al. | |
| 4,539,507 A | 9/1985 | VanSlyke et al. | |
| 4,552,927 A | 11/1985 | Warren | |
| 4,568,483 A | 2/1986 | Naarmann et al. | |
| 4,731,408 A | 3/1988 | Jasne | |
| 4,795,543 A | 1/1989 | Stetter et al. | |
| 4,869,979 A * | 9/1989 | Ohtani et al. | 429/213 |
| 4,889,659 A | 12/1989 | Genies | |
| 4,933,106 A * | 6/1990 | Sakai et al. | 252/500 |
| 4,940,525 A | 7/1990 | Ezzell | |
| 4,959,430 A | 9/1990 | Jonas et al. | |
| 4,973,391 A | 11/1990 | Madou et al. | |
| 4,987,042 A | 1/1991 | Jonas et al. | |
| 5,002,700 A | 3/1991 | Otagawa et al. | |
| 5,035,926 A | 7/1991 | Jonas et al. | |
| 5,066,731 A | 11/1991 | Feldhues et al. | |
| 5,069,820 A | 12/1991 | Jen et al. | |
| 5,115,057 A | 5/1992 | Ono et al. | |
| 5,126,017 A | 6/1992 | Nakama et al. | |
| 5,160,457 A | 11/1992 | Elsenbaumer et al. | |
| 5,185,100 A | 2/1993 | Han et al. | |
| 5,233,000 A | 8/1993 | Yodice et al. | |
| 5,247,190 A | 9/1993 | Friend et al. | |
| 5,254,633 A | 10/1993 | Han | |
| 5,258,461 A | 11/1993 | Facci et al. | |
| 5,281,363 A | 1/1994 | Shacklette et al. | |
| 5,281,680 A | 1/1994 | Grot | |
| 5,286,413 A | 2/1994 | Hannecart et al. | |
| 5,294,504 A | 3/1994 | Otagawa et al. | |
| 5,300,575 A | 4/1994 | Jonas et al. | |
| 5,312,681 A | 5/1994 | Muys | |
| 5,317,169 A | 5/1994 | Nakano et al. | |
| 5,354,613 A | 10/1994 | Quintens et al. | |
| 5,370,981 A | 12/1994 | Krafft et al. | |
| 5,372,924 A | 12/1994 | Quintens et al. | |
| 5,378,402 A | 1/1995 | Cross et al. | |
| 5,378,403 A | 1/1995 | Shacklette et al. | |
| 5,408,109 A | 4/1995 | Heeger et al. | |
| 5,463,005 A | 10/1995 | Desmarteau | |
| 5,489,400 A | 2/1996 | Liu et al. | |
| 5,537,000 A | 7/1996 | Alivisatos et al. | |
| 5,554,179 A | 9/1996 | Stroetmann et al. | |
| 5,567,356 A | 10/1996 | Kinlen | |
| 5,578,249 A | 11/1996 | Ohtani et al. | |
| 5,585,038 A | 12/1996 | Kirmanen et al. | |
| 5,705,888 A | 1/1998 | Staring et al. | |
| 5,716,550 A | 2/1998 | Gardner et al. | |
| 5,723,873 A | 3/1998 | Yang | |
| 5,766,515 A | 6/1998 | Jonas et al. | |
| 5,773,150 A | 6/1998 | Tong et al. | |
| 5,792,830 A | 8/1998 | Noding et al. | |
| 5,798,170 A | 8/1998 | Zhang et al. | |
| 5,863,465 A | 1/1999 | Kinlen | |
| 5,869,350 A | 2/1999 | Heeger et al. | |
| 5,910,385 A | 6/1999 | Gardner et al. | |
| 5,911,918 A | 6/1999 | Shacklette et al. | |
| 5,917,279 A | 6/1999 | Elschner et al. | |
| 5,965,281 A | 10/1999 | Cao | |
| 5,986,400 A | 11/1999 | Staring et al. | |
| 5,994,496 A | 11/1999 | Van Haare et al. | |
| 6,004,483 A | 12/1999 | Jonas et al. | |
| 6,018,018 A | 1/2000 | Samuelson et al. | |
| 6,030,550 A | 2/2000 | Angelopoulos et al. | |
| 6,083,635 A | 7/2000 | Jonas et al. | |
| 6,097,147 A | 8/2000 | Baldo et al. | |
| 6,136,909 A | 10/2000 | Liao et al. | |
| 6,150,426 A | 11/2000 | Curtin et al. | |
| 6,197,418 B1 | 3/2001 | Cloots et al. | |
| 6,205,016 B1 | 3/2001 | Niu | |
| 6,210,790 B1 | 4/2001 | Crivello | |
| 6,225,040 B1 | 5/2001 | Muys et al. | |
| RE37,370 E | 9/2001 | Cao | |
| 6,303,238 B1 | 10/2001 | Thompson et al. | |
| 6,303,943 B1 | 10/2001 | Yu et al. | |
| 6,319,428 B1 | 11/2001 | Michot et al. | |
| 6,324,091 B1 | 11/2001 | Gryko et al. | |
| 6,337,370 B1 | 1/2002 | Bae et al. | |
| 6,340,496 B1 | 1/2002 | Cloots et al. | |
| 6,358,437 B1 | 3/2002 | Jonas et al. | |
| 6,376,105 B1 | 4/2002 | Jonas et al. | |
| 6,391,481 B1 | 5/2002 | Jonas et al. | |
| 6,452,711 B1 | 9/2002 | Heuer et al. | |
| 6,507,428 B1 | 1/2003 | Heuer et al. | |
| 6,515,314 B1 | 2/2003 | Duggal et al. | |
| 6,593,690 B1 | 7/2003 | McCormick et al. | |
| 6,611,096 B1 | 8/2003 | McCormick et al. | |
| 6,632,472 B2 | 10/2003 | Louwet et al. | |
| 6,670,645 B2 | 12/2003 | Grushin et al. | |
| 6,685,853 B1 | 2/2004 | Angelopoulos et al. | |
| 6,706,963 B2 | 3/2004 | Gaudiana et al. | |
| 6,710,123 B1 | 3/2004 | Amin-Sanayei | |
| 6,713,567 B2 | 3/2004 | Bekiarian et al. | |
| 6,717,358 B1 | 4/2004 | Liao et al. | |
| 6,756,474 B2 | 6/2004 | Hsu | |
| 6,759,441 B1 | 7/2004 | Kerres et al. | |
| 6,777,515 B2 | 8/2004 | Bekiarian et al. | |
| 6,830,828 B2 | 12/2004 | Thompson et al. | |
| 6,875,523 B2 | 4/2005 | Grushin et al. | |
| 6,923,881 B2 | 8/2005 | Tateishi et al. | |
| 6,924,047 B2 | 8/2005 | Radu et al. | |
| 6,955,772 B2 | 10/2005 | Van den Bogaert | |
| 6,955,773 B2 | 10/2005 | Hsu | |
| 6,963,005 B2 | 11/2005 | Lecloux et al. | |
| 6,967,236 B1 | 11/2005 | Angelopoulos et al. | |
| 7,071,289 B2 | 7/2006 | Sotzing | |
| 7,112,369 B2 | 9/2006 | Wang et al. | |
| 7,166,010 B2 | 1/2007 | Lamansky et al. | |
| 7,189,771 B2 | 3/2007 | Hsu | |
| 7,202,369 B2 | 4/2007 | Baik et al. | |
| 7,211,202 B2 | 5/2007 | Korzhenko et al. | |
| 7,211,824 B2 | 5/2007 | Lazarev | |
| 7,244,797 B2 | 7/2007 | Kurihara et al. | |
| 7,250,461 B2 * | 7/2007 | Hsu et al. | 524/445 |
| 7,307,276 B2 | 12/2007 | Andriessen | |
| 7,317,047 B2 | 1/2008 | Hsu | |
| 7,318,982 B2 | 1/2008 | Gozdz et al. | |
| 7,338,620 B2 | 3/2008 | Hsu et al. | |
| 7,341,801 B2 | 3/2008 | Reuter et al. | |
| 7,351,358 B2 | 4/2008 | Hsu et al. | |
| 7,354,532 B2 | 4/2008 | Hsu et al. | |
| 7,371,336 B2 | 5/2008 | Hsu et al. | |
| 7,390,438 B2 | 6/2008 | Hsu et al. | |
| 7,431,866 B2 | 10/2008 | Hsu et al. | |
| 7,455,793 B2 * | 11/2008 | Hsu et al. | 252/500 |
| 7,462,298 B2 | 12/2008 | Hsu et al. | |
| 7,569,158 B2 | 8/2009 | Waller et al. | |
| 7,593,004 B2 | 9/2009 | Spath et al. | |
| 7,638,072 B2 | 12/2009 | Hsu et al. | |
| 7,722,785 B2 | 5/2010 | Hsu et al. | |
| 7,727,421 B2 | 6/2010 | Hsu et al. | |
| 7,749,407 B2 | 7/2010 | Hsu et al. | |
| 7,837,901 B2 | 11/2010 | Hsu et al. | |
| 8,088,499 B1 | 1/2012 | Wang et al. | |
| 2001/0016303 A1 | 8/2001 | Majumdar et al. | |
| 2001/0019782 A1 | 9/2001 | Igarashi et al. | |
| 2001/0038937 A1 | 11/2001 | Suzuki et al. | |
| 2002/0009680 A1 | 1/2002 | Majumdar et al. | |
| 2002/0017612 A1 | 2/2002 | Yu et al. | |
| 2002/0038999 A1 | 4/2002 | Cao et al. | |
| 2002/0041151 A1 | 4/2002 | Park et al. | |
| 2002/0045713 A1 | 4/2002 | Feiring et al. | |
| 2002/0076576 A1 | 6/2002 | Li | |
| 2002/0098377 A1 | 7/2002 | Cao et al. | |
| 2002/0099119 A1 | 7/2002 | Craig | |
| 2002/0127381 A1 | 9/2002 | Will et al. | |
| 2002/0132164 A1 | 9/2002 | Kaneko et al. | |
| 2002/0136923 A1 | 9/2002 | Jonas et al. | |
| 2002/0146442 A1 | 10/2002 | Sendelbach et al. | |
| 2002/0190250 A1 | 12/2002 | Grushin et al. | |

(56) References Cited

U.S. PATENT DOCUMENTS

| | | |
|---|---|---|
| 2002/0192476 A1 | 12/2002 | Kambe et al. |
| 2003/0008190 A1 | 1/2003 | Chisholm et al. |
| 2003/0020073 A1 | 1/2003 | Long et al. |
| 2003/0108771 A1 | 6/2003 | Lecloux et al. |
| 2003/0118829 A1 | 6/2003 | Hsu |
| 2003/0146436 A1 | 8/2003 | Parker et al. |
| 2003/0176628 A1 | 9/2003 | Groenendaal et al. |
| 2003/0213952 A1 | 11/2003 | Iechi et al. |
| 2003/0222250 A1 | 12/2003 | Hsu |
| 2003/0227001 A1 | 12/2003 | Li et al. |
| 2004/0009346 A1 | 1/2004 | Jang et al. |
| 2004/0010115 A1 | 1/2004 | Sotzing |
| 2004/0036067 A1 | 2/2004 | Andriessen |
| 2004/0044214 A1 | 3/2004 | Andriessen |
| 2004/0064152 A1 | 4/2004 | Zvuloni |
| 2004/0072987 A1 | 4/2004 | Groenendaal et al. |
| 2004/0092700 A1 | 5/2004 | Hsu |
| 2004/0097741 A1 | 5/2004 | Groenendaal et al. |
| 2004/0102577 A1 | 5/2004 | Hsu et al. |
| 2004/0124504 A1 | 7/2004 | Hsu |
| 2004/0126666 A1 | 7/2004 | Cao et al. |
| 2004/0127637 A1 | 7/2004 | Hsu et al. |
| 2004/0147765 A1 | 7/2004 | Baik et al. |
| 2004/0149952 A1 | 8/2004 | DePenning et al. |
| 2004/0149962 A1 | 8/2004 | Andriessen |
| 2004/0181011 A1 | 9/2004 | Korzhenko et al. |
| 2004/0206942 A1 | 10/2004 | Hsu |
| 2004/0214985 A1 | 10/2004 | Martin et al. |
| 2004/0217877 A1 | 11/2004 | Kokonaski et al. |
| 2004/0222413 A1 | 11/2004 | Hsu et al. |
| 2004/0254297 A1 | 12/2004 | Hsu et al. |
| 2004/0262599 A1 | 12/2004 | Bernds et al. |
| 2004/0266924 A1 | 12/2004 | Yang |
| 2005/0033015 A1 | 2/2005 | Pei |
| 2005/0035335 A1 | 2/2005 | Han et al. |
| 2005/0049319 A1 | 3/2005 | Stone et al. |
| 2005/0052027 A1 | 3/2005 | Priem |
| 2005/0059168 A1 | 3/2005 | Bazan |
| 2005/0064152 A1 | 3/2005 | Aylward et al. |
| 2005/0069726 A1 | 3/2005 | Douglas et al. |
| 2005/0070654 A1 | 3/2005 | Hsu |
| 2005/0089679 A1 | 4/2005 | Ittel et al. |
| 2005/0124784 A1 | 6/2005 | Sotzing |
| 2005/0175861 A1 | 8/2005 | Elschner et al. |
| 2005/0184287 A1 | 8/2005 | Herron et al. |
| 2005/0202274 A1 | 9/2005 | Elschner et al. |
| 2005/0205860 A1 | 9/2005 | Hsu et al. |
| 2005/0208328 A1 | 9/2005 | Hsu et al. |
| 2005/0209388 A1 | 9/2005 | Hsu et al. |
| 2005/0209392 A1 | 9/2005 | Luo et al. |
| 2005/0222333 A1 | 10/2005 | Hsu |
| 2005/0224765 A1 | 10/2005 | Hsu et al. |
| 2005/0224788 A1 | 10/2005 | Hsu et al. |
| 2005/0272214 A1 | 12/2005 | Chiang et al. |
| 2006/0051401 A1 | 3/2006 | Manohar |
| 2006/0076050 A1 | 4/2006 | Williams et al. |
| 2006/0076557 A1 | 4/2006 | Waller et al. |
| 2006/0076577 A1 | 4/2006 | Boos et al. |
| 2006/0113510 A1 | 6/2006 | Luo et al. |
| 2006/0180810 A1 | 8/2006 | Lee et al. |
| 2006/0202171 A1 | 9/2006 | Yoshida et al. |
| 2006/0274049 A1 | 12/2006 | Spath et al. |
| 2006/0289843 A1 | 12/2006 | Hsu et al. |
| 2006/0292362 A1 | 12/2006 | Hsu et al. |
| 2007/0045591 A1 | 3/2007 | Hsu et al. |
| 2007/0066755 A1 | 3/2007 | Hsu et al. |
| 2007/0069184 A1 | 3/2007 | Hsu et al. |
| 2007/0069185 A1 | 3/2007 | Hsu et al. |
| 2007/0096082 A1 | 5/2007 | Gaynor et al. |
| 2007/0129534 A1 | 6/2007 | Ohata et al. |
| 2007/0172702 A1 | 7/2007 | Elschner et al. |
| 2007/0215864 A1 | 9/2007 | Luebben et al. |
| 2008/0023676 A1 | 1/2008 | Hsu |
| 2008/0128662 A1 | 6/2008 | Hsu et al. |
| 2008/0135809 A1 | 6/2008 | Hsu |
| 2008/0191172 A1 | 8/2008 | Hsu |
| 2008/0191614 A1 | 8/2008 | Kim et al. |
| 2008/0193773 A1 | 8/2008 | Hsu et al. |
| 2008/0210910 A1 | 9/2008 | Hsu et al. |
| 2008/0213594 A1 | 9/2008 | Hsu |
| 2008/0248314 A1 | 10/2008 | Hsu et al. |
| 2008/0251768 A1 | 10/2008 | Hsu et al. |
| 2008/0258605 A1 | 10/2008 | Yukinobu |
| 2008/0283800 A1 | 11/2008 | Hsu |
| 2008/0286605 A1 | 11/2008 | Takeda |
| 2008/0296536 A1 | 12/2008 | Hsu et al. |
| 2009/0008609 A1 | 1/2009 | Yeisley et al. |
| 2009/0072201 A1 | 3/2009 | Hsu et al. |
| 2009/0114884 A1 | 5/2009 | Hsu |
| 2009/0154059 A1 | 6/2009 | Wessling et al. |
| 2009/0318710 A1 | 12/2009 | Brassat et al. |
| 2010/0127222 A1 | 5/2010 | Hsu et al. |

FOREIGN PATENT DOCUMENTS

| | | |
|---|---|---|
| CN | 1439029 A | 8/2003 |
| CN | 1934725 A | 3/2007 |
| DE | 2029556 A1 | 12/1971 |
| DE | 3938094 A1 | 5/1991 |
| DE | 4211459 A1 | 10/1993 |
| DE | 4334390 A1 | 4/1995 |
| DE | 10018750 A1 | 1/2001 |
| DE | 102004006583 A1 | 9/2005 |
| DE | 102004010811 A1 | 9/2005 |
| EP | 245987 A2 | 10/1991 |
| EP | 560721 A2 | 9/1993 |
| EP | 269090 A1 | 2/1994 |
| EP | 356239 A2 | 2/1995 |
| EP | 517379 A1 | 6/1995 |
| EP | 361322 A2 | 11/1995 |
| EP | 440957 A2 | 3/1996 |
| EP | 488321 A1 | 10/1997 |
| EP | 817540 A2 | 1/1998 |
| EP | 828184 A1 | 3/1998 |
| EP | 593111 A1 | 6/1998 |
| EP | 1026152 A1 | 8/2000 |
| EP | 1079397 A1 | 2/2001 |
| EP | 761691 A2 | 1/2002 |
| EP | 1191612 A2 | 3/2002 |
| EP | 1191614 A2 | 3/2002 |
| EP | 1227529 A2 | 7/2002 |
| EP | 1231251 A1 | 8/2002 |
| EP | 1286569 A1 | 2/2003 |
| EP | 1054414 A1 | 3/2003 |
| EP | 1061530 A1 | 3/2003 |
| EP | 962943 A1 | 12/2003 |
| EP | 1371709 A1 | 12/2003 |
| EP | 1384739 A1 | 1/2004 |
| EP | 1408563 A2 | 4/2004 |
| EP | 949283 A1 | 4/2005 |
| EP | 949308 A1 | 4/2005 |
| EP | 1546237 A2 | 6/2005 |
| EP | 1564250 A1 | 8/2005 |
| EP | 1564251 A1 | 8/2005 |
| EP | 1615971 A2 | 1/2006 |
| EP | 1647566 A2 | 4/2006 |
| EP | 1726051 A1 | 11/2006 |
| EP | 1730212 A1 | 12/2006 |
| EP | 1810986 A2 | 7/2007 |
| FR | 2632979 A1 | 12/1989 |
| GB | 2124635 A | 2/1984 |
| JP | 62119237 A | 5/1987 |
| JP | 62138582 A | 6/1987 |
| JP | 62164717 A | 7/1987 |
| JP | 63135453 A | 6/1988 |
| JP | 63215772 A | 9/1988 |
| JP | 64065123 A | 3/1989 |
| JP | 01138237 U | 9/1989 |
| JP | 02160823 A | 6/1990 |
| JP | 02209931 A | 8/1990 |
| JP | 02249221 A | 10/1990 |
| JP | 04234453 A | 8/1992 |
| JP | 04306230 A | 10/1992 |
| JP | 05129162 A | 5/1993 |

(56) References Cited

FOREIGN PATENT DOCUMENTS

| | | |
|---|---|---|
| JP | 05214080 A | 8/1993 |
| JP | 05255576 A | 10/1993 |
| JP | 05262981 A | 10/1993 |
| JP | 06073271 A | 3/1994 |
| JP | 06264024 A | 9/1994 |
| JP | 06306280 A | 11/1994 |
| JP | 06313038 A | 11/1994 |
| JP | 07010973 A | 1/1995 |
| JP | 07090060 A | 4/1995 |
| JP | 07157549 A | 6/1995 |
| JP | 07165892 A | 6/1995 |
| JP | 08048850 A | 2/1996 |
| JP | 08048858 A | 2/1996 |
| JP | 09176310 A | 7/1997 |
| JP | 10261418 A | 9/1998 |
| JP | 10509751 A | 9/1998 |
| JP | 11186103 A | 7/1999 |
| JP | 11353934 A | 12/1999 |
| JP | 2000091081 A | 3/2000 |
| JP | 2000505249 A | 4/2000 |
| JP | 2000336154 A | 12/2000 |
| JP | 2001006878 A | 1/2001 |
| JP | 2001035276 A | 2/2001 |
| JP | 2001106782 A | 4/2001 |
| JP | 2001504872 A | 4/2001 |
| JP | 2001270999 A | 10/2001 |
| JP | 2001325831 A | 11/2001 |
| JP | 2002500408 A | 1/2002 |
| JP | 2002505356 A | 2/2002 |
| JP | 2002082082 A | 3/2002 |
| JP | 2002246177 A | 8/2002 |
| JP | 2002293888 A | 10/2002 |
| JP | 2003040856 A | 2/2003 |
| JP | 2003158043 A | 5/2003 |
| JP | 2003187983 A | 7/2003 |
| JP | 2003217862 A | 7/2003 |
| JP | 2003261749 A | 9/2003 |
| JP | 2003264083 A | 9/2003 |
| JP | 2003297582 A | 10/2003 |
| JP | 2003301116 A | 10/2003 |
| JP | 2004500449 A | 1/2004 |
| JP | 2004501494 T | 1/2004 |
| JP | 2004502004 A | 1/2004 |
| JP | 2004082395 A | 3/2004 |
| JP | 2004099678 A | 4/2004 |
| JP | 2004107552 A | 4/2004 |
| JP | 2004197095 A | 7/2004 |
| JP | 2004231939 A | 8/2004 |
| JP | 2004523623 A | 8/2004 |
| JP | 2004532307 A | 10/2004 |
| JP | 2004534892 A | 11/2004 |
| JP | 2004537612 A | 12/2004 |
| JP | 2005108504 A | 4/2005 |
| JP | 2005120363 A | 5/2005 |
| JP | 2005139376 A | 6/2005 |
| JP | 2005145987 A | 6/2005 |
| JP | 2005226072 A | 8/2005 |
| JP | 2005232452 A | 9/2005 |
| JP | 2005536595 A | 12/2005 |
| JP | 2005537348 A | 12/2005 |
| JP | 2006500461 A | 1/2006 |
| JP | 2006500463 A | 1/2006 |
| JP | 2006502254 A | 1/2006 |
| JP | 2006108064 A | 4/2006 |
| JP | 2006515315 A | 5/2006 |
| JP | 2006152251 A | 6/2006 |
| JP | 2006225658 A | 8/2006 |
| JP | 2006527277 A | 11/2006 |
| JP | 2007502531 A | 2/2007 |
| JP | 2007191715 A | 8/2007 |
| JP | 2007529607 A | 10/2007 |
| JP | 2007531802 A | 11/2007 |
| JP | 2008546898 A | 12/2008 |
| JP | 2008546900 A | 12/2008 |
| JP | 2008547185 A | 12/2008 |
| JP | 2009502025 A | 1/2009 |
| JP | 2009270117 A | 11/2009 |
| JP | 2010534739 A | 11/2010 |
| KR | 100613311 B1 | 8/2006 |
| RU | 2035803 C1 | 5/1995 |
| TW | 463524 B | 11/2001 |
| TW | 505927 B | 10/2002 |
| TW | 200304238 | 9/2003 |
| TW | 1327152 | 7/2010 |
| WO | 9305519 A1 | 3/1993 |
| WO | 9614343 A1 | 5/1996 |
| WO | 9801909 A1 | 1/1998 |
| WO | 9831716 A1 | 7/1998 |
| WO | 9934371 A1 | 7/1999 |
| WO | 9945048 A1 | 9/1999 |
| WO | 9952954 A1 | 10/1999 |
| WO | 0070655 A2 | 11/2000 |
| WO | 0138219 A1 | 5/2001 |
| WO | 0141230 A1 | 6/2001 |
| WO | 0141512 A1 | 6/2001 |
| WO | 0199192 A2 | 12/2001 |
| WO | 0199207 A2 | 12/2001 |
| WO | 0200759 A1 | 1/2002 |
| WO | 0202714 A2 | 1/2002 |
| WO | 0205354 A1 | 1/2002 |
| WO | 0215645 A1 | 2/2002 |
| WO | 0242352 A2 | 5/2002 |
| WO | 02065484 A1 | 8/2002 |
| WO | 02079316 A2 | 10/2002 |
| WO | 02080627 A2 | 10/2002 |
| WO | 02099907 A1 | 12/2002 |
| WO | 03006515 A1 | 1/2003 |
| WO | 03006537 A1 | 1/2003 |
| WO | 03008424 A1 | 1/2003 |
| WO | 03012908 A2 | 2/2003 |
| WO | 03040257 A1 | 5/2003 |
| WO | 03046540 A1 | 6/2003 |
| WO | 03048228 A1 | 6/2003 |
| WO | 03050824 A1 | 6/2003 |
| WO | 03063555 A1 | 7/2003 |
| WO | 03074601 A2 | 9/2003 |
| WO | 03091688 A2 | 11/2003 |
| WO | 2004016710 A1 | 2/2004 |
| WO | 2004018544 A1 | 3/2004 |
| WO | 2004019345 A1 | 3/2004 |
| WO | 2004020444 A1 | 3/2004 |
| WO | 2004020502 A1 | 3/2004 |
| WO | 2004029128 A2 | 4/2004 |
| WO | 2004029133 A1 | 4/2004 |
| WO | 2004029176 A1 | 4/2004 |
| WO | 2004031192 A1 | 4/2004 |
| WO | 2004094501 A2 | 11/2004 |
| WO | 2004105150 A1 | 12/2004 |
| WO | 2004106404 A1 | 12/2004 |
| WO | 2004106409 A1 | 12/2004 |
| WO | 2005003083 A1 | 1/2005 |
| WO | 2005018012 A1 | 2/2005 |
| WO | 2005024853 A1 | 3/2005 |
| WO | 2005041217 A1 | 5/2005 |
| WO | 2005052027 A1 | 6/2005 |
| WO | 2005080525 A2 | 9/2005 |
| WO | 2005090434 A1 | 9/2005 |
| WO | 2005090435 A1 | 9/2005 |
| WO | 2005090436 A1 | 9/2005 |
| WO | 2005093872 A1 | 10/2005 |
| WO | 2005098872 A2 | 10/2005 |
| WO | 2005121217 A1 | 12/2005 |
| WO | 2006073968 A2 | 7/2006 |
| WO | 2006078264 A2 | 7/2006 |
| WO | 2007002681 A2 | 1/2007 |
| WO | 2007002683 A2 | 1/2007 |
| WO | 2007002737 A2 | 1/2007 |
| WO | 2007002740 A2 | 1/2007 |
| WO | 2007092296 A2 | 8/2007 |
| WO | 2007120143 A1 | 10/2007 |
| WO | 2009018009 A1 | 2/2009 |

OTHER PUBLICATIONS

Opposition Against EP 1730212; Proposed Main Request and Auxiliary Claims One to Nine; Jun. 25, 2012.

(56) References Cited

OTHER PUBLICATIONS

USPTO Patent Examiners Answer to Appeal Brief for U.S. Appl. No. 12/006,912; May 4, 2011.
USPTO Patent Trial and Appeal Board Decision for U.S. Appl. No. 12/006,912; Nov. 30, 2012.
U.S. Appl. No. 10/803,114 (Issued as US Patent 7,250,461; Jul. 31, 2007; This is the US counterpart to EP1730212) [Not submitted but granted patent listed on IDS].
U.S. Appl. No. 60/413,202 [Related to granted patent US 7,431,866; listed on IDS; Provisional document not submitted].
U.S. Appl. No. 60/464,369 (Issued as granted patent US 7,431,866, listed on IDS; Provisional document not submitted).
U.S. Appl. No. 60/464,370 [Provisional document not submitted].
EPO Official Action for Application No. EP 03770524.1, counterpart to U.S. Appl. No. 10/669,577; filed Feb. 25, 2010; R. Kiebooms, Examiner.
EPO Official Letter regarding Application No. EP 05736268.3; Nov. 11, 2008.
European Patent Office Communication in EP Application No. 07810131,Sep. 24, 2009.
PCT International Search Report for Application No. PCT/US2003/030512, counterpart to U.S. Appl. No. 10/669,577; R. Kiebooms Authorized Officer, filed Feb. 19, 2004.
PCT International Search Report for International Application No. PCT/US2003/030026; R. Kiebooms Authorized Officer, Mar. 24, 2004.
PCT International Search Report for International Application No. PCT/US2004/012564; R. Kiebooms, Authorized Officer; Jan. 14, 2005.
PCT International Search Report for PCT/US2005/008563; R. Kiebooms Authorized Officer; Jun. 17, 2005.
PCT International Search Report for Application No. PCT/US2005/012461; C. Meiners Authorized Officer; Jul. 29, 2005.
PCT International Search Report for International Application No. PCT/US 05/008764, counterpart to U.S. Appl. No. 10/803,114; F. Rousseau, Authorized Officer; filed Aug. 3, 2005.
PCT International Search Report for International Application No. PCT/US2005/008763, counterpart to U.S. Appl. 10/802,341; F. Rousseau, Authorized Officer; filed Aug. 3, 2005.
PCT International Search Report for International Application No. PCT/US2006/25013, counterpart to U.S. Appl. No. 11/475,715; Lee W. Young, Authorized Officer; filed Jan. 16, 2007.
PCT International Search Report for International Application No. PCT/US2007/015323, counterpart to U.S. Appl. No. 11/770,822; D. Marsitzky Authorized Officer; filed Dec. 18, 2007.
PCT International Search Report for Application No. PCT/US2007/026438, counterpart to U.S. Appl. No. 11/960,381; Dirk Marsitzky, Authorized Officer; filed Apr. 22, 2008.
PCT International Search Report for Application No. PCT/US2007/026512; Bernhard Glomm, Authorized Officer; May 9, 2008.
PCT International Search Report for Application No. PCT/US2008/070718, counterpart to U.S. Appl. No. 12/177,359; Benedikt Schlicke, Authorized Officer; filed Oct. 31, 2008.
PCT International Search Report for Application No. PCT/US2009/035079; Lee W. Young, Authorized Officer; Apr. 9, 2009.
PCT International Search Report for Application No. PCT/US2010/061680, counter part to U.S. Appl. No. 12/643,556; Shin, Ju Cheol, Examiner: KIPO; filed Sep. 29, 2011.
Opposition Against EP 1 546 237 B1; H. C. Starck Clevios GmbH, Goslar, Germany, May 13, 2009 (German Original).
Opposition Against EP 1 546 237 B1; H. C. Starck Clevios GmbH, Goslar, Germany, May 13, 2009 (English Translation).
Opposition Against EP 1 546 237 B1; E. I. du Pont de Nemours and Company, Wilmington, Delaware, Observations of the Patent Proprietor, Mar. 1, 2010.
Opposition Against EP 1 546 237 B1; E. I. du Pont de Nemours and Company, Wilmington, Delaware, Observations of the Patent Proprietor, Mar. 1, 2010., Annex, Declaration of Dr Hjalti Skulason dated Feb. 24, 2010.
Opposition Against EP 1 546 237 B1; E. I. du Pont de Nemours and Company, Wilmington, Delaware, Observations of the Patent Proprietor, Mar. 1, 2010, Annex, Experimental Data, Sep. 21-Oct. 6, 2009.
Opposition Against EP 1 546 237; Decision Revoking European Patent; EPO Opposition Division; Dec. 8, 2011.
Opposition Against EP 1 546 237 B1; Patentee's Grounds for Appeal; Apr. 18, 2012.
Opposition Against EP 1546237: Proposed Main Request and Auxiliary Claims One to Five; Apr. 18, 2012.
Opposition Against EP 1546237; Declaration of Hjalti Skulason (D32); Apr. 30, 2012.
Opposition Agains EP 1546237; Report on the Attempted Reproduction of the Synthesis in D4 (Pickup) and Example 7 of the Opposed Patent (D31); Apr. 18, 2012.
Opposition Against EP 1615971 B1; H. C. Starck Clevios GmbH, Goslar, Germany, Mar. 2, 2010 (English Translation).
Opposition Against EP 1615971 B1; H. C. Starck Clevios GmbH, Goslar, Germany, Mar. 2, 2010 (German Original).
Opposition Against EP 1615971; Summons to Oral Proceedings before the EPO; Sep. 19, 2011.
Opposition Against EP 1615971; Observations of the Patent Proprietor; Dec. 6, 2011.
Opposition Against EP 1615971; Proposed Main Request and Auxiliary Claims One to Five; Dec. 6, 2011.
Opposition Against EP 1615971; Letter from Opponent, H.C. Starck Clevios GmbH, Dec. 22, 2011 (German Original).
Opposition Against EP 1615971; Letter from Opponent, H.C. Starck Clevios GmbH, Dec. 22, 2011(English Translation).
Opposition Against EP 1615971; Grounds of Appeal of the Patentee; Appeal No. T1708/12-3.4.02; Sep. 28, 2012.
Opposition Against EP 1615971; (E9) Experimental Data: Effect of pH on Buffer Layer Materials Containing Co-Dispersing Liquids; Sep. 28, 2012.
Opposition Against EP 1615971; Proposed Main Request and Auxiliary Claims One to Four; Sep. 28, 2012.
Opposition Against EP 1615971; Grounds of Appeal of the Opposition; Appeal No. T1708/12-3.4.02; Sep. 27, 2012 (German Original).
Opposition Against EP 1615971; Grounds of Appeal of the Opposition; Appeal No. T1708/12-3.4.02; Sep. 27, 2012 (English Trans).
Opposition Against EP 1615971; Grounds of Complaint of the Opposition; Appeal No. T1708/12-3.4.02; Apr. 11, 2013 (German Original).
Opposition Against EP 1615971; Grounds of Complaint of the Opposition; Appeal No. T1708/12-3.4.02; Apr. 11, 2013 (English Machine Translation).
Opposition Against EP 1615971; Patentee's Response to the Appeal; Appeal No. T1708/12-3.3.03; Apr. 15, 2013.
Opposition Against EP 1615971; (E11) Experimental Data: Effect of Co-Dispersing Liquid on PEDOT Polymerization in the Presence of Nafion; Apr. 15, 2013.
Opposition Against EP 1615971; Proposed Main Request and Auxiliary Claims One to Fourteen; Apr. 15, 2013.
Opposition Against EP 1730212; Opposition Document from Herzog Fiesser & Partner; Heraeus Precious Metals GmbH; Aug. 10, 2011 [German].
Opposition Against EP 1730212; Opposition Document from Herzog Fiesser & Partner; Heraeus Precious Metals GmbH; Aug. 10, 2011 [English Translation].
Opposition Against EP 1730212; Correspondence of the Patent Holder to EPO, Jun. 16, 2008 [D3].
Opposition Against EP 1730212; Observations of the Patentee; Jun. 25, 2012.
Opposition Against EP 1730212; Experimental Data I: Polypyrroles; Jun. 25, 2012 [D23].
Opposition Against EP 1730212; Experimental Data II: Synthesis of Polypyrrole-Nafion Composite; Jun. 25, 2012 [D24].
Laha, S.C. et al., "Highly Selective Epoxidation of Olefinic Compounds Over TS-1 and TS-2 Redox Molecular Sieves using Anhydrous Urea-Hydrogen Peroxide as Oxidizing Agent," Journal of Catalysis, 2002, 208(2), 339-344.
Lee et al., Poly(thieno(3,4-b)thiophene) A New Stable Low Band Gap Conducting Polymer, Macromolecules, 2001, vol. 34, pp. 5746-5747.

(56) References Cited

OTHER PUBLICATIONS

Lefebvre et al., "Chemical Synthesis, Characterization, and Electrochemical Studies of Poly(3,4-ethylenedioxythiophene)/Poly(styrene-4-sulfonate) Composites," Chem. Mater., 1999, vol. 11, pp. 262-268, American Chemical Society.

Levi et al., "Polymer and Cathode Emission Studies of Polymer-Based Light-Emitting Diodes Under Strong Electrical Pulse Excitation," Journal of Applied Physics, 2000, vol. 88, No. 5, pp. 2548-2552.

Lewis, Hawley's Condensed Chemical Dictionary, 12th Ed., 1993, pp. 300-301.

Li et al., "Large-Scale Synthesis of Aligned Carbon Nanotubes," Science, 1996, vol. 274, pp. 1701-1703.

Lim et al., "Degradation of Organic Light-Emitting Devices Due to Formation and Growth of Dark Spots," Materials Science and Engineering, 2001, pp. 154-159.

Lima, A., "Electropolymerization of and 3,4-ethylenedioxtyiophene and 3,4-Ethylenedioxythiophene Methanol in the Persence of Dodecylbenezenesulfonate," Synthetic Metals, 1998, 93, 33-41.

Madler et al., "Visibly Transparent and Radiopaque Inorganic Organic Composites from Flame-Made Mixed-Oxide Fillers," Journal of Nanoparticle Research, 2005, vol. 8, No. 3-4, pp. 323-333.

Markus et al., Electronics and Nucleonics Dictionary, pp. 470-471 & 476 (McGraw-Hill 1966).

Marrion, "Binders for Waterborne Coatings," The Chemistry and Physics of Coatings, Second Edition, 2004.

Moeller et al., "A Polymer/Semiconductor Write-Once Read-Many-Times Memory," Nature, 2003, vol. 426, pp. 166-169.

Morrison & Boyd, Organic Chemistry, 6th Ed., 1994, pp. 312-317.

Nafion Definition; Wikipedia; Downloaded on May 13, 2009. (German)

Nafion Definition; Wikipedia; Downloaded on Feb. 18, 2010. (English)

O'Brien et al., "Electrophosphorescence From a Doped Polymer Light Emitting Diode," Synthetic Metals, 2001, vol. 116(1-3), pp. 379-383.

Pickup et al., "Electronically conducting cation-exchange polymer powders: synthesis, characterization and applications in PEM fuel cells and supercapacitors," Journal of New Materials for Electrochemical Systems, vol. 3, 2000, pp. 21-26.

Qi et al., "Size Control of Polypyrrole Particles," Chem. Mater., 1997, vol. 9, pp. 2934-2939, American Chemical Society.

Riedel et al., "Tailored Highly Transparent Composite Hole-Injection Layer Consisting of Pedot:PSS and SiO2 Nanoparticles for Efficient Polymer Light-Emitting Diodes," Advanced Materials, 2011, vol. 23, pp. 740-745.

Römpp Chemistry Dictionary, 9th Edition, 1993, pp. 2459-2460 (German original and English translation).

Sajiki et al., "Efficient C-H/C-D Exchange Reaction on the Alkyl Side Chain of Aromatic Compounds Using Heterogeneous Pd/C in D2O," Org. Lett., 2004, vol. 6(9), pp. 1485-1487.

Schottland P. et al., "Synthesis and Polymerization of New Monomers Derived From 3, 4-Ethylenedioxythiophene" Journal De Chimie Physique, Societe De Chimie Physique, Paris, Fr. vol. 95, No. 6, Jan. 1, 1998, pp. 1258-1261.

Schroedner et al., "Organische Feldeffekttransisoren auf Basis Halbleitender Polymere/Organic Field-Effect Transistors Based on Semiconducting Polymers," Elektrotechnik und Informationstechnik, Springer Verlag, 2003, vol. 120, No. 6, pp. 205-209.

Schwendeman et al; "Perfluoroalkanoate-substituted PEDOT for Electronic Device Applications," Advanced Functional Materials, vol. 13, No. 7, 2003, pp. 541-547.

Segura, J.L., et al., "Synthesis and Electropolymerization of a Perylenebisimide-Functionalized 3, 4-Ethylenedioxythiophene Derivative," Organic Letters, vol. 7, No. 12, 2005, pp. 2345-2348.

Sharpe et al., "Improved Cationic Conductive Polymer," Calgon Corp. Coating Conference (Proceeding), 1981, pp. 83-87.

Simpson et al., "Advances and Applications of Inherently Conductive Polymer Technologies Based on Poly(3,4-Ethylenedioxythiophene)," 2005 AIMCAL Fall Technical Conference.

Sotzing et al., "Poly(thieno(3,4-b)thiophene): A p- and n-Dopable Polythiophene Exhibiting High Optical Transparency in the Semiconducting State," Macromolecules, 2002, vol. 35, pp. 7281-7286.

Stejskal et al., "Polyaniline Dispersions 10. Coloured Microparticles of Variable Density Prepared Using Stabilizer Mixtures," Colloid Polymer Science, vol. 278, 2000, pp. 654-658.

Sun et al, "Catalytic Oxidation Polymerization of Aniline in an H2O2-Fe2+System," Journal of Applied Polymer Science, 1999, vol. 72, pp. 1077-1084.

Sze, S.M., Physics of Semiconductor Devices, 2nd Edition,1981, John Wiley & Sons, p. 492 Tang et al., "Organic/Inorganic Material for Coating on Metals," Materials Research Society Symp. Proc., vol. 734, 2003, pp. B.9.57.1-7.

Thelakkat et al., "Poly(triarylamine)s—Synthesis and Application in Electroluminescent Devices and Photovoltaics," Synthetic Metals, 1999, vol. 102, pp. 1125-1128.

Thess et al., "Crystalline Ropes of Metallic Carbon Nanotubes," Science, 1996, vol. 273, pp. 483-487.

Unknown, The Experimental Chemistry Course, 4th Ed., vol. 20, Organic Synthesis II—Alcohol and Amines, 1992, pp. 49-51 (Japanese Only).

Venturello, C. et al., "A Convenient Catalytic Method for the Dihydroxylation of Alkenes by Hydrogen Peroxide," Synthesis, 1989, 4, 295-297.

Wang, "Photoconductive Materials," Kirk-Othmer Encyclopedia of Chemical Technology, Fourth Edition, 1996, vol. 18, pp. 837-860.

Watts et al., "A novel deuterium effect on dual charge-transfer and ligand-field emission of the cis-dichlorobis(2,2'-bipyridine)indium(III) ion," Journal of the American Chemical Society, 1979, vol. 101(10), pp. 2742-2743.

Wu et al., "Transparent, Conductive Carbon Nanotube Films," Science, 2004, vol. 305, pp. 1273-1276.

Yang et al., "The photoelectrochemical properties of TiO2 electrodes modified by quantum sized PbS and thiols", Synthetic Metals, 2001, vol. 123, No. 2, pp. 267-272.

Yuan et al., "Size and morphology effects of ZnO anode nanomaterials for Zn/Ni secondary batteries; Size and morphology effects of ZnO anode nanomaterials for Zn/Ni secondary batteries", Nanotechnology, 2005, vol. 16, No. 6, pp. 803-808.

CAS reg. No. 126213-51-2, Apr. 6, 1990.

CAS reg. No. 31175-20-9, Nov. 16, 1984.

Decision 19931229; Case No. T0860/93; Application No. 88115147. 6, 1993.

Decision 19971120; Case No. T1078/93-3.3.5; Application No. 90905154.2; Publication No. 0462216; Process for Improving the Physical and Catalytic Properties of a Fluid Cracking Catalyst, 1997.

Decision 20020117; Case No. T0939/98-3.3.3; Application No. 95910871.3; Publication No. 0742800; Two-phase Acidic Aqueous Compositions for Diffusion Transfer Products, 2002.

Decision 20080729; Case No. T0114/06-3.3.02; Application No. 04013422.3; Publication No. 1452171; Pharmaceutical Liquid Suspensions, 2008.

European Search Report and Opinion for Application No. EP06785660; Supplemental Search Report; Chrisian Meiners, Examiner; Munich, Germany; Feb. 4, 2010.

Extended European Search Report for Application No. EP10 01 2649; Rafael Kiebooms, Mar. 1, 2011.

EPO Official Action for Application No. EP 05725618.2; R. Kiebooms, Primary Examiner; May 31, 2011.

EPO Official Action for Application No. 07863277.5, counterpart to U.S. Appl. No. 11/960,381; Dirk Marsitzky, Examiner; filed Mar. 7, 2013.

"DuPont Fuel Cells—DuPont Nafion PFSA Membranes NE-1135, N-115, N-117, Ne-1110," Jan. 1, 2005, pp. 1-4.

"Colloid," Definition from IUPAC Gold Book, Apr. 17, 2012.

"Colloid," Wikipedia entry, Nov. 4, 2012.

"Conductive Polymer," Definition from Wikipedia, The Free Encyclopedia.

"Dispersion Chemistry", Wikipedia entry, Nov. 4, 2012.

(56) References Cited

OTHER PUBLICATIONS

Agibalova et al., "Supramolecular Organization of Polyfluorinated Copolymers in Solutions," Polymer Science, Ser. A, 1998, vol. 40, No. 6, pp. 615-621 (Translated from Vysokomolkuyarnye Soedineniya, Seriya A I Seriya B, 40 [6], pp. 1009-1016, 1998).
Aldrich Catalog, Germany; 1994-1995; p. 1137; as evidence of product with catalog No. 27,740-4.
Aleshin et al., "Transport Properties of Poly(3,4-ethylenedioxythiophene)/poly(styrenesulfonate)," Synthetic Metals, 1998, vol. 94, pp. 173-177.
Angelopoulos et al., "Polyaniline: Solutions, Films and Oxidation State," Molecular Crystals and Liquid Crystals, 1988, vol. 160, pp. 151-163.
Appleby et al., "Polymeric Perfluoro Bis-Sulfonomides as Possible Fuel Cell Electrolytes," Journal of the Electrochemical Society, 1993, vol. 140, No. 1, pp. 109-111.
Arnautov et al., "New Dopant-Solvent System for Conductive PAN Films Production," Synthetic Metals, 1997, vol. 84, No. 1-3, pp. 133-134, Elsevier Science S.A.
ASTM, Standard Practice for Testing the Shelf Life of Ink Jet Printer Cartridges.
Barthet et al., "Aspects of the Conducting Properties of Nafion Doped Polyaniline", Electrochimica Acta, 1996, vol. 41, No. 18, pp. 2791-2798.
Barthet et al., "Mixed electronic and ionic conductors: a new route to Nafion-doped polyaniline" in Journal of Electroanalytical Chemistry, 1995, vol. 388, pp. 45-44.
Baytron Coating Guide Issue Oct. 2002—Obtained From www.hcstarck-echemicals.com.
Baytron H. C. Stark GmbH (Brochure) no date.
Baytron P. VAP A1 4083 and Baytron P VP CH 8000 Product Information for Electronic Grades Designed for Use As Hole-Injection Material in OLEDS—Obtained From www.hcstarck-echemicals.com.
Baytron Product info from baytron.com; Aug. 1, 2007.
Bharathan et al., "Polymer/metal Interfaces and the Performance of Polymer Light-Emitting Diodes, " Journal of Applied Physics, 1998, vol. 84(6), pp. 3207-3211.
Boix et al., "Efficient H-D Exchange of Aromatic Compounds in Near-Critical D20 Catalysed by a Polymer-Supported Sulphonic Acid," Tetrahedron Letters 40, 1999, pp. 4433-4436.
Brown et al, "Built-in field electroabsorbtion spectroscopy of plymer light-emitting diodes incorporating a doped poly (3,4-ethylene dioxythiophene) hole injection layer," Applied Physics Letters, AIP, American Institute of Physics, 1999, vol. 75, No. 12, pp. 1679-1681.
Campbell et al., "Excitation Transfer Processes in a Phosphor-Doped Poly 9p-phenylene vinylene) Light-Emitting Diode," Physical Review B., vol. 65, 085210-1-085210-8.
Caras-Quintero et al., "Efficient Synthesis of 3,4-ethylenedioxythiophenes by Mitsunobu Reaction" Chemical Communications, Chemcom, Royal Society of Chemistry, GB, vol. 22, Nov. 4, 2002, pp. 2690-2691.
Caras-Quintero et al., "Synthesis of the First Enantiomerically Pure and Chiral, Disubstituted 3,4-ethylenedioxythiophenes (EDOTs) and Corresponding Stereo- and Regioregular PEDOTs," Chemical Communication, 2004, pp. 926-927.
Cassel et al., "Original Synthesis of Linear, Branched and Cyclic Oligoglycerol Standards," European Journal of Organic Chemistry, 2001, No. 5, pp. 875-896.
Cen et al., "1,1,2,2-Tetrafluoro-2-(polyfluoroalkoxy)ethanesulfonic Acids, 1,1,2,2-Tetrafluoro-2-(perfluoroalkoxy)ethanesulfonic Acids, and 2,2'-Oxybis(1,1,2,2-tetrafluoroethanesulfonic acid)," Inorganic Chemistry, 1988, vol. 27, pp.1376-1377, American Chemical Society.
Colvin et al., "Light-Emitting Diodes Made from Cadmium Selenide Nanocrystals and a Semiconducting Polymer," Nature, 1994, vol. 370, pp. 354-357.
Constantini et al., "Infrared Spectroscopic Study of Polaron Formation in Electrochemically Synthesized Poly(3-alkylpyrroles)," Phys. Chem. Chem. Phys.,2003 vol. 5, pp. 749-757.
Desmarteau, Novel Perfluoinated Ionomers and Ionenes, Journal of Fluorine Chemistry, 1995, vol. 72, pp. 203-208.
Downs et al., "Efficient Polymerization of Aniline at Carbon Nanotube Electrodes", Advanced Materials, 1999, vol. 11, No. 12, pp. 1028-1031.
England et al; "Nucleophilic Reactions of Fluoro-olefins," Journal of American Chemical Society (1960) v. 82, p. 5116.
Esaki et al., "Efficient H/D Exchange Reactions of Alkyl-Substituted Benzene Derivatives by Means of the Pd/C—H2— D2O System," Chemistry: A European Journal, 2007, vol. 13, pp. 4052-4063.
Feiring et al., "Aromatic Monomers with Pendant Fluoroalkylsulfonate and Sulfonimide Groups," Journal of Fluorine Chemistry, 2000, vol. 105, No. 1, pp. 129-135.
Feiring et al., "Novel Aromatic Polymers with Pendant Lithium Perfluoroalkylsulfonate or Sulfinimide Groups," Macromolecules, 2000, vol. 33, pp. 9262-9271.
Fowler et al., "Hydrogen detection by Polyaniline nanofibers on gold and platinum electrodes", The Journal of Physical Chemistry C, 2001, vol. 113, No. 16, pp. 6444-6449.
Gao et al., "Soluble polypyrrole as the transparent anode in polymer light-emitting diodes," Synthetic Metals, 1996, vol. 82, pp. 221-223, 82, Elsevier Science S.A.
Guo et al., "Aromatic H/D Exchange Reaction Catalyzed by Groups 5 and 6 Metal Chlorides," Chinese Journal of Chemistry, 2005, vol. 23, pp. 341-344.
Gustafsson et al., "Flexible Light-Emitting Diodes Made from Soluble Conducting Polymers," Nature, 1992, vol. 357, pp. 477-479.
Hackley et al., The Use of Nomenclature in Dispersion Science and Technology, NIST, Aug. 2001, pp. 2-4, 10, 11.
Hirai et al; "Electrochemical Behaviors of Polypyrrole, Poly-3-Methyl-thiophene, and Polyaniline Deposited on Nafion-Coated Electrodes," Journal of the Electrochemical Society, vol. 135, No. 5, May 1, 1988, pp. 1132-1137, Electrochemical Society, Manchester, NH.
Hong et al, "Association of Nafion with Polypyrrole Nanoparticles in a Hydrophilic Polymer Network: Effects on Proton Transport," Journal of Colloid and Interface Science, vol. 218 pp. 233-242; Oct. 1, 1999.
Hsu, "Novel Preparation and Properties of Conductive Polyaniline/Nafion® Film," Synthetic Metals, 1991, vol. 41-43, pp. 671-674, Elsevier Sequoia, The Netherlands.
Huang et al., "Well-Dispersed Single-Walled Carbon Nanotube/Polyaniline Composite Films," Carbon, vol. 41, 2003, pp. 2731-2736.
Iijima et al., Single-Shell Carbon Nanotube of 1-nm Diameter, Nature, 1993, vol. 363, pp. 603-605.
Ivanov et al., "The Study of Carbon Nanotubules Produced by Catalytic Method," Chemical Physics Letters, 1994, vol. 223, pp. 329-335.
Jiang et al., "Preparation of a Nation Composite Membrane using a Porous Teflon Support," Journal of Membrane Science, Elsevier Scientific Publ. Co., Amsterdam, NL, vol. 132, No. 2, Sep. 3, 1997, pp. 273-276.
Jong et al., "Stability of the Interface between Indium-tin-oxide and Poly(3,4-ethylenedioxythiophene)/poly (styrenesulfonate) in Polymer Light-Emitting Diodes," Applied Physics Letters, 2000, vol. 77, No. 14, pp. 2255-2257.
Journet et al., "Large-Scale Production of Single-Walled Carbon Nanotubes by the Electric-Arc Technique," Nature, 1997, vol. 388, pp. 756-758.
Kim et al., "Enhancement of Electrical Conductivity of Poly(3,4-ethylenedioxythiophene)/Poly(4-styrenesulfonate) by a Change of Solvents," Synthetic Metals, 2002, vol. 126, No. 2/3, pp. 311-316.
Kitani et al., "Properties of Elastic Polyaniline," Synthetic Metals, 1997, vol. 84, No. 1-3, pp. 83-84, Elsevier Science S.A.

* cited by examiner

WATER DISPERSIBLE POLYPYRROLES MADE WITH POLYMERIC ACID COLLOIDS FOR ELECTRONICS APPLICATIONS

RELATED APPLICATION DATA

This application is a continuation application and claims priority under 35 U.S.C. §120 from U.S. application Ser. No. 12/006,912 (filed on 7 Jan. 2008, now abandoned); which in turn is a divisional application and claims priority under 35 U.S.C. 120 from of U.S. patent application Ser. No. 10/802,341 (now U.S. Pat. No. 7,351,358 granted on 1 Apr. 2008) filed on 17 Mar. 2004, all of which are incorporated by reference herein in the entirety.

FIELD OF THE INVENTION

The invention relates to aqueous dispersions of electrically conducting polymers of pyrrole, wherein the electrically conducting polymer is synthesized in the presence of polymeric acid colloids.

BACKGROUND OF THE INVENTION

Electrically conducting polymers have been used in a variety of organic electronic devices, including in the development of electroluminescent ("EL") devices for use in light emissive displays. With respect to EL devices, such as organic light emitting diodes (OLEDs) containing conducting polymers, such devices generally have the following configuration:

anode/buffer layer/EL material/cathode

The anode is typically any material that is transparent and has the ability to inject holes into the EL material, such as, for example, indium/tin oxide (ITO). The anode is optionally supported on a glass or plastic substrate. EL materials include fluorescent dyes, fluorescent and phosphorescent metal complexes, conjugated polymers, and mixtures thereof. The cathode is typically any material (such as, e.g., Ca or Ba) that has the ability to inject electrons into the EL material.

The buffer layer is typically an electrically conducting polymer and facilitates the injection of holes from the anode into the EL material layer. The buffer layer can also be called a hole-injection layer, a hole transport layer, or may be characterized as part of a bilayer anode. Typical conducting polymers employed as buffer layers include polyaniline and polydioxythiophenes such as poly(3,4-ethylenedioxythiophene) (PEDT). These materials can be prepared by polymerizing aniline or dioxythiophene monomers in aqueous solution in the presence of a water soluble polymeric acid, such as poly (styrenesulfonic acid) (PSS) as described in, for example, U.S. Pat. No. 5,300,575 entitled "Polythiophene dispersions, their production and their use". A well known PEDT/PSS material is Baytron®-P, commercially available from N.C. Starck, GmbH (Leverkusen, Germany).

Electrically conducting polypyrroles are typically prepared by polymerizing pyrrole or substituted pyrrole monomers in aqueous solution by an oxidative polymerization using an oxidizing agent such as ammonium persulfate (APS), sodium persulfate, potassium persulfate, ferric chloride, or ferric sulfate. The aqueous solution generally contains a water soluble sulfonic acid. In general, enough of the acid is present to function as counter-anions to balance the positively charge polypyrrole backbone, wherein formation of the polypyrrole cation/polymeric acid anion complex renders the polypyrroles electrically conductive. Polypyrrole is available commercially as a 5 wt % aqueous solution from Sigma-Aldrich (St. Louis, Mo.).

The aqueous electrically conductive polymer dispersions synthesized with water soluble polymeric sulfonic acids have undesirable low pH levels. The low pH can contribute to decreased stress life of an EL device containing such material, and contribute to corrosion within the device.

There is a need for improved conductive polymers.

SUMMARY OF THE INVENTION

Compositions are provided comprising aqueous dispersions of at least one polypyrrole and at least one colloid-forming polymeric acid.

In another embodiment of the invention, there are provided methods for making the aqueous dispersions of at least one polypyrrole and at least one colloid-forming polymeric acid, comprising forming a combination of water, at least one pyrrole monomer, at least one colloid-forming polymeric acid, and an oxidizing agent, in any order, provided that at least a portion of the colloid-forming polymeric acid is present when at least one of the pyrrole monomer and the oxidizing agent is added.

In another embodiment, electronic devices comprising at least one layer comprising the new composition are provided.

The foregoing general description and the following detailed description are exemplary and explanatory only and are not restrictive of the invention, as defined in the appended claims.

BRIEF DESCRIPTION OF THE FIGURES

The invention is illustrated by way of example and not limited in the accompanying figures.

DETAILED DESCRIPTION OF THE INVENTION

Figure 1:
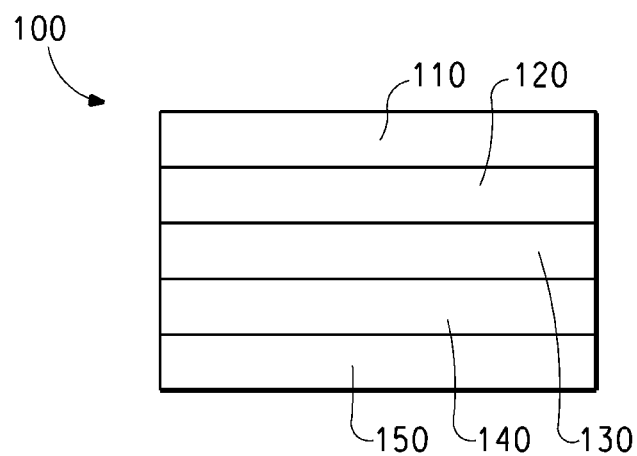
FIG. 1 illustrates a cross-sectional view of an electronic device that comprises a buffer layer according to the invention.

In one embodiment of the invention, compositions are provided comprising aqueous dispersions of at least one polypyrrole and at least one colloid-forming polymeric acid.

In one embodiment, the new compositions comprise a continuous aqueous phase in which at least one polypyrrole and at least one colloid-forming polymeric acid are dispersed.

Polypyrrole contemplated for use in the practice of the present invention have Formula I below.

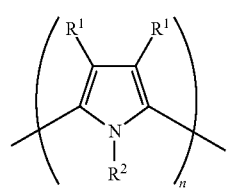

(I)

where in Formula I:

n is greater than about 4;

$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and may be substituted with one or more $R^2$ groups;

$R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, amidosulfonate, benzyl, carboxylate, ether, ether carboxylate, ether sulfonate, and urethane.

The polypyrrole may be a homopolymer or co-polymer of two or more pyrrole monomeric units. The aqueous dispersions of polypyrrole and colloid-forming polymeric acid can comprise one or more than one polypyrrole polymer and one or more than one colloid-forming polymeric acid.

In one embodiment, the polypyrrole is a positively charged conductive polymer.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, ether carboxylate, amino, amidosulfonate, ether sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, amino, amidosulfonate, hydroxyl, epoxy, silane, or siloxane moieties.

In one embodiment, the polypyrrole is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, ether sulfonate, amidosulfonate, alkylamidosulfonate, amidoalkylsulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 5 carbon atoms.

In one embodiment, both $R^1$ together form —O—$(CHY)_m$—O—, where m is 2 or 3, and Y is the same or different at each occurrence and is selected from hydrogen, alkyl, alcohol, benzyl, carboxylate, ether, ether carboxylate, amino, alkylamidosulfonate, amidoalkylsulfonate, ether sulfonate, and urethane. In one embodiment, at least one Y group is not hydrogen. In one embodiment, at least one Y group is a substituent having F substituted for at least one hydrogen. In one embodiment, at least on Y group is perfluorinated.

As used herein, the term "dispersion" refers to a continuous liquid medium containing a suspension of minute particles. The "continuous medium" comprises an aqueous liquid. As used herein, the term "aqueous" refers to a liquid that has a significant portion of water and in one embodiment it is at least about 40% by weight water. As used herein, the term "colloid" refers to the minute particles suspended in the continuous medium, said particles having a nanometer-scale particle size. As used herein, the term "colloid-forming" refers to substances that form minute particles when dispersed in aqueous solution, i.e., "colloid-forming" polymeric acids are not water-soluble.

As used herein, the term "co-dispersing liquid" refers to a substance which is liquid at room temperature and is miscible with water. As used herein, the term "miscible" means that the co-dispersing liquid is capable of being mixed with water (at concentrations set forth herein for each particular co-dispersing liquid) to form a substantially homogeneous solution.

The term "layer" or "film" refers to a coating covering a desired area. The area can be as large as an entire device or as small as a specific functional area such as the actual visual display, or as small as a single sub-pixel. Films can be formed by any conventional deposition technique, including vapor deposition and liquid deposition. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:
"alcohol"—$R^3$—OH
"amidosulfonate"—$R^3$—C(O)N($R^6$)$R^4$—SO$_3$Z
"benzyl"—CH$_2$—C$_6$H$_5$
"carboxylate"—$R^3$—C(O)O—Z
"ether"—$R^3$—O—$R^5$
"ether carboxylate"—$R^3$—O—$R^4$—C(O)O—Z
"ether sulfonate"—$R^3$—O—$R^4$—SO$_3$Z
"urethane"—$R^3$—O—C(O)—N($R^6$)$_2$
where all "R" groups are the same or different at each occurrence and:
$R^3$ is a single bond or an alkylene group
$R^4$ is an alkylene group
$R^5$ is an alkyl group
$R^6$ is hydrogen or an alkyl group
Z is H, alkali metal, alkaline earth metal, N($R^5$)$_4$ or $R^5$
Any of the above groups may further be unsubstituted or substituted, and any group may have F substituted for one or more hydrogens, including perfluorinated groups.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Colloid-forming polymeric acids contemplated for use in the practice of the new compositions are insoluble in water, and form colloids when dispersed into an aqueous medium. The polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any polymeric acid that is colloid-forming when dispersed in water is suitable for use in the practice of the invention. In one embodiment, the colloid-forming polymeric acid is polymeric sulfonic acid. Other acceptable polymeric acids include polymeric phosphoric acids, polymeric phosphonic acids, polymeric carboxylic acids, polymeric acrylic acids, and mixtures thereof, including mixtures having polymeric sulfonic acids. In another embodiment, the polymeric sulfonic acid is fluorinated. In still another embodiment, the colloid-forming polymeric sulfonic acid is perfluorinated. In yet another embodiment, the colloid-forming polymeric sulfonic acid is a perfluoroalkylenesulfonic acid.

In still another embodiment, the colloid-forming polymeric acid is a highly-fluorinated sulfonic acid polymer ("FSA polymer"). "Highly fluorinated" means that at least about 50% of the total number of halogen and hydrogen atoms in the polymer are fluorine atoms, and in one embodiment at least about 75%, and in another embodiment at least about 90%. In another embodiment, the polymer is perfluorinated. The term "sulfonate functional group" refers to either to sulfonic acid groups or salts of sulfonic acid groups, and in one embodiment alkali metal or ammonium salts. The functional group is represented by the formula $-SO_3X$ where X is a cation, also known as a "counterion". X may be H, Li, Na, K or $N(R_1)(R_2)(R_3)(R_4)$, and $R_1$, $R_2$, $R_3$, and $R_4$ are the same or different and are in one embodiment H, $CH_3$ or $C_2H_5$. In one embodiment, X is H, in which case the polymer is said to be in the "acid form". X may also be multivalent, as represented by such ions as $Ca^{++}$, and $Al^{+++}$. It is clear to the skilled artisan that in the case of multivalent counterions, represented generally as $M^{n+}$, the number of sulfonate functional groups per counterion will be equal to the valence "n".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group ($-SO_2F$), which can be subsequently hydrolyzed to a sulfonate functional group. For example, copolymers of a first fluorinated vinyl monomer together with a second fluorinated vinyl monomer having a sulfonyl fluoride group ($-SO_2F$) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

Possible second monomers include fluorinated vinyl ethers with sulfonate functional groups or precursor groups which can provide the desired side chain in the polymer. Additional monomers, including ethylene, propylene, and $R'-CH=CH_2$ where R' is a perfluorinated alkyl group of 1 to 10 carbon atoms, can be incorporated into these polymers if desired. The polymers may be of the type referred to herein as random copolymers, that is copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, the FSA polymers for use in the present invention include a highly fluorinated, including those that are perfluorinated, carbon backbone and side chains represented by the formula

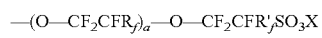

wherein $R_f$ and $R'_f$ are independently selected from F, Cl or a perfluorinated alkyl group having 1 to 10 carbon atoms, a=0, 1 or 2, and X is H, Li, Na, K or $N(R1)(R2)(R3)(R4)$ and R1, R2, R3, and R4 are the same or different and in one embodiment are H, $CH_3$ or $C_2H_5$. In another embodiment X is H. As stated above, X may also be multivalent.

The preferred FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

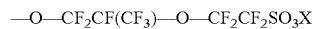

where X is as defined above. FSA polymers of this type are disclosed in U.S. Pat. No. 3,282,875 and can be made by copolymerization of tetrafluoroethylene (TFE) and the perfluorinated vinyl ether $CF_2=CF-O-CF_2CF(CF_3)-O-CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a preferred polymer of the type disclosed in U.S. Pat. Nos. 4,358,545 and 4,940,525 has the side chain $-O-CF_2CF_2SO_3X$, wherein X is as defined above. This polymer can be made by copolymerization of tetrafluoroethylene (TFE) and the perfluorinated vinyl ether $CF_2=CF-O-CF_2CF_2SO_2F$, perfluoro(3-oxa-4-pentenesulfonyl fluoride) (POPF), followed by hydrolysis and further ion exchange as necessary.

The FSA polymers for use in this invention have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. With most polymers, the IXR is about 3 to about 33, and in one embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—$CF_2$—$CF(CF_3)$—O—$CF_2$—$CF_2$—$SO_3H$ (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —O—$CF_2CF_2SO_3H$ (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The synthesis of FSA polymers is well known. The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid compositions composition can be adjusted by methods known in the art.

Aqueous dispersions of the FSA polymers have particle sizes as small as possible and an EW as small as possible, so long as a stable colloid is formed.

Aqueous dispersions of FSA polymer are available commercially as Nafion® dispersions, from E.I. du Pont de Nemours and Company (Wilmington, Del.).

In one embodiment, stable aqueous dispersions are prepared by first synthesizing an electrically conducting polypyrrole in the presence of an aqueous colloid-forming polymeric acid dispersion, thereby forming an as-synthesized aqueous dispersion comprising the electrically conducting polypyrroles and the colloidal polymeric acid. The electrically conducting polypyrroles employed in invention methods are typically prepared by oxidatively polymerizing pyrrole or substituted pyrrole monomers in an aqueous colloid-forming polymeric acid dispersion in the presence of an oxidizing agent, such as ammonium persulfate (APS), sodium persulfate, potassium persulfate and the like. The oxidative polymerization results in a stable, aqueous dispersion containing positively charged conductive polymeric pyrrole and/or substituted pyrrole that is charge balanced by the negatively charged side chains of the polymeric acids contained within the colloids, for examples, sulfonate anion, carboxylate anion, acetylate anion, phosphate anion, phosphonate anion, combinations, and the like.

The new method of making an aqueous dispersion of at least one polypyrrole and at least one colloid-forming polymeric acid includes forming a reaction mixture by combining water, pyrrole monomer, colloid-forming polymeric acid, and oxidizing agent, in any order, provided that at least a portion of the colloid-forming polymeric acid is present when at least one of the pyrrole monomer and the oxidizing agent is added.

In one embodiment, the colloid-forming polymeric acid is all FSA, and the co-dispersing liquid of the FSA dispersion is optionally removed prior to or after polymerization of pyrrole monomers.

The pyrrole monomer generally has Formula II below

where $R^1$ and $R^2$ are as defined above.

In one embodiment, the method of making the aqueous dispersion of at least one polypyrrole and at least one colloid-forming polymeric acid includes:

(a) providing an aqueous dispersion of a colloid-forming polymeric acid;

(b) adding an oxidizing agent to the dispersion of step (a); and (c) adding a pyrrole monomer to the dispersion of step (b).

In another embodiment, the pyrrole monomer is added to the aqueous dispersion of the colloid-forming polymeric acid prior to adding the oxidizing agent. Step (b) above, which is adding oxidizing agent, is then carried out.

In another embodiment, a mixture of water and the pyrrole monomer is formed, in a concentration typically in the range of about 0.5% by weight to about 4.0% by weight pyrrole. This pyrrole mixture is added to the aqueous dispersion of the colloid-forming polymeric acid, and steps (b) above which is adding oxidizing agent is carried out.

In another embodiment, the aqueous polymerization dispersion may include a polymerization catalyst, such as ferric sulfate, ferric chloride, and the like, which has a higher oxidizing potential than ammonium persulafate and the like. The catalyst is added before the last step. In another embodiment, a catalyst is added together with an oxidizing agent.

In one embodiment, the polymerization is carried out in the presence of co-dispersing liquids which are miscible with water. Examples of suitable co-dispersing liquids include, but are not limited to ethers, alcohols, alcohol ethers, cyclic ethers, ketones, nitriles, sulfoxides, amides, and combinations thereof. In one embodiment, the co-dispersing liquid comprises at least one alcohol. In one embodiment, the co-dispersing liquid comprises at least one organic solvent selected from n-propanol, isopropanol, t-butanol, dimethylacetamide, dimethylformamide, N-methylpyrrolidone, and mixtures thereof. In one embodiment, the amount of co-dispersing liquid is less than about 60% by volume. In one embodiment, the amount of co-dispersing liquid is less than about 30% by volume. In one embodiment, the amount of co-dispersing liquid is between about 5 and 50% by volume. The use of a co-dispersing liquid in the polymerization significantly reduces particle size and improves filterability of the dispersions. In one embodiment, buffer layer materials obtained by this process show an increased viscosity and films prepared from these dispersions are of high quality.

The co-dispersing liquid can be added to the reaction mixture at any point in the process. For example, the co-dispersing liquid can be added after completion of polymerization, but added prior to, during or after completion of ion-exchange resin treatment step which is described later.

In one embodiment, the polymerization is carried out in the presence of a co-acid. The co-acid can be an inorganic acid, such as HCl, sulfuric acid, and the like, or an organic acid, such as p-toluenesulfonic acid, dodecylbenzenesulfonic acid, methanesulfonic acid, trifluoromethanesulfonic acid, camphorsulfonic acid, acetic acid and the like. Alternatively, the co-acid can be a water soluble polymeric acid such as poly (styrenesulfonic acid), poly(2-acrylamido-2-methyl-1-propanesulfonic acid, or the like, or at least a second colloid-forming acid, as described above. Combinations of co-acids can be used.

The co-acid can be added to the reaction mixture at any point in the process prior to the addition of either the oxidizing agent or the pyrrole monomer, whichever is added last. In one embodiment, the co-acid is added before both the pyrrole monomer and the colloid-forming polymeric acid, and the oxidizing agent is added last. In one embodiment the co-acid is added prior to the addition of the pyrrole monomer, followed by the addition of the colloid-forming polymeric acid, and the oxidizing agent is added last.

In one embodiment, the polymerization is carried out in the presence of both a co-dispersing liquid and a co-acid. Devices with buffer layers made from polypyrrole/Nafion® that was polymerized in the presence of a co-acid and to which an alcohol was added at the end of polymerization, show high efficiencies, low operating voltages, and low current density.

In the method of making the aqueous dispersion of at least one polypyrrole and at least one colloid-forming polymeric acid, the molar ratio of oxidizing agent to pyrrole monomer is generally in the range of 0.1 to 2.0; and in one embodiment is 0.4 to 1.5. The molar ratio of colloid-forming polymeric acid to pyrrole monomer is generally in the range of 0.2 to 5. In one embodiment, the ratio is in the range of 1 to 4. The overall solid content is generally in the range of about 1.0% to 10% in weight percentage; and in one embodiment of about 2% to 4.5%. The reaction temperature is generally in the range of about 4° C. to 50° C.; in one embodiment about 20° C. to 35° C. The molar ratio of optional co-acid to pyrrole monomer is about 0.05 to 4. The addition time of the oxidizing agent influences particle size and viscosity. Thus, the particle size can be reduced by slowing down the addition speed. In parallel, the viscosity is increased by slowing down the addition speed. The reaction time is generally in the range of about 1 to about 30 hours.

As synthesized, the aqueous dispersions of polypyrrole and polymeric acid colloids generally have a very low pH. It has been found that the pH can be adjusted to typically be between about 1 to about 8, without adversely affecting the properties in devices. It is frequently desirable to have a pH which is approximately neutral, as the acidity can be corrosive. It has been found that the pH can be adjusted using known techniques, for example, ion exchange or by titration with an aqueous basic solution.

In one embodiment, the pyrrole monomers are combined with the aqueous reaction mixture comprising colloid-forming polymeric acid particles, the oxidizing agent and the catalyst therein by dispensing the pyrrole monomer in a controlled rate of addition while continuously mixing the reaction mixture to form a monomer-meniscus in the reaction mixture.

In one embodiment, the oxidizing agent predissolved in water is combined with the aqueous reaction mixture comprising colloid-forming polymeric acid particles, pyrrole monomer and the catalyst therein by dispensing the oxidizing agent solution in a controlled rate of addition while continuously mixing the reaction mixture.

In one embodiment, the oxidizing agent and the pyrrole monomer are added separately and simultaneously to the reaction mixture, at the same or different controlled rates of addition, to achieve the final desired quantity of oxidizing agent, so as to consume the monomer at a controlled rate in the oxidative polymerization reaction.

In one embodiment, the controlled rate of addition of pyrrole monomer is determined in view of the quantity of materials used with the goal of controlling the rate of monomer addition from the dispensing mechanism to ensure dissolution in the reaction mixture quickly. With the controlled addition, the polymerization and oxidation chemistry take place in an even and uniform manner. Examples of the dispensing mechanism include, but are not limited to, tubing, syringes, pipettes, nozzle guns, sprayers, hoes, pipes and the like. In one embodiment, a perforated end, such as a fritted-glass plate, or small diameter tubing attached to the equipment described above is desired for creating monomer-meniscus in the reaction mixture.

The rate of addition depends upon the size of the reaction, the speed at which the solution is stirred and the geometry and number of the dispensing end of the dispensing mechanism orifice. In one embodiment, the dispensing end of the dispensing mechanism is submerged in the reaction mixture containing the aqueous colloid-forming polymeric acid. For example, addition rates of pyrrole monomer of about 1-1000 micro liter per hour for a reaction mixture size of about 100-500 grams of aqueous colloid-forming polymeric acid composition. In one embodiment the rate of addition is between about 5-100 micro liters per hour for about 500 grams of the aqueous colloid-forming polymeric acid. For reaction mixtures of other sizes (larger or smaller) the rate of addition can be linearly scaled in the appropriate direction.

In one embodiment, a reaction vessel is charged first with a mixture of water, alcohol co-dispersing agent, and inorganic co-acid. To this is added, in order, at least one pyrrole monomer, and an aqueous dispersion of fluorinated polymeric sulfonic acid colloids, and an oxidizing agent. The oxidizing agent is added slowly and dropwise to prevent the formation of localized areas of high ion concentration which can destabilize the acid colloids. The mixture is stirred and the reaction is then allowed to proceed at a controlled temperature. When polymerization is completed, the reaction mixture is treated with a strong acid cation resin, stirred and filtered; and then treated with a base anion exchange resin, stirred and filtered. Alternative orders of addition can be used, as discussed above.

In one embodiment, after completion of the polymerization reaction, the as-synthesized aqueous dispersion is contacted with at least one ion exchange resin under conditions suitable to remove decomposed species, side reaction products, and unreacted monomers, removal of ionic impurities and to adjust pH, thus producing a stable, aqueous dispersion with a desired pH. In one embodiment, the as-synthesized aqueous dispersion is contacted with a first ion exchange resin and a second ion exchange resin, in any order. The as-synthesized aqueous dispersion can be treated with both the first and second ion exchange resins simultaneously, or it can be treated sequentially with one and then the other.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as cation exchangers or anion exchangers. Cation exchangers have positively charged mobile ions available for exchange, typically protons or metal ions such as sodium ions. Anion exchangers have exchangeable ions which are negatively charged, typically hydroxide ions.

In one embodiment, the first ion exchange resin is a cation, acid exchange resin which can be in protonic or metal ion, typically sodium ion, form. The second ion exchange resin is a basic, anion exchange resin. Both acidic, cation including proton exchange resins and basic, anion exchange resins are contemplated for use in the practice of the invention. In one embodiment, the acidic, cation exchange resin is an inorganic acid, cation exchange resin, such as a sulfonic acid cation exchange resin. Sulfonic acid cation exchange resins contemplated for use in the practice of the new compositions include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphorous cation exchange resin. In addition, mixtures of different cation exchange resins can be used.

In another embodiment, the basic, anionic exchange resin is a tertiary amine anion exchange resin. Tertiary amine anion exchange resins contemplated for use in the practice of the new compositions include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-synthesized aqueous dispersion either simultaneously, or consecutively. For example, in one embodiment both resins are added simultaneously to an as-synthesized aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins renders the acidic sites more basic, resulting in increased pH of the dispersion. In general, about one to five grams of ion exchange resin is used per gram of polypyrrole/polymeric acid colloid.

In one embodiment, the basic ion exchange resin can be used to adjust the pH to the desired level. In one embodiment, the pH can be further adjusted with an aqueous basic solution such as a solution of sodium hydroxide, ammonium hydroxide, or the like.

In one embodiment, the reaction mixture may further comprise a co-dispersing agent, a co-acid, a catalyst, an oxidizing agent, or mixtures thereof.

In another embodiment, more conductive dispersions are formed by the addition of highly conductive additives to the aqueous dispersions of polypyrrole and the colloid-forming polymeric acid. Because dispersions with relatively high pH can be formed, the conductive additives, especially metal additives, are not attacked by the acid in the dispersion. Moreover, because the polymeric acids are colloidal in nature, having the surfaces predominately containing acid groups, electrically conducting polypyrrole is formed on the colloidal surfaces. Because of this unique structure, only a low weight percentage of highly conductive additives, is needed to reach the percolation threshold. Examples of suitable conductive additives include, but are not limited to conductive polymers, metal particles and nanoparticles, metal nanowires, carbon nanotubes, carbon nanoparticles, graphite fibers or particles, carbon particles, and combinations thereof. A dispersing agent may be included to facilitate dispersing of the conductive additives.

In one embodiment, the new compositions are deposited to form electrically conductive or semiconductive layers which are used alone, or in combination with other electroactive materials, as electrodes, electroactive elements, photoactive elements, or bioactive elements. As used herein, the terms "electroactive element", "photoactive element" and "bioactive element" refer to elements which exhibit the named activity in response to a stimulus, such as an electromagnetic field, an electrical potential, solar energy radiation, and a biostimulation field.

In one embodiment, the new compositions are deposited to form buffer layers in an electronic device. The term "buffer layer" as used herein, is intended to mean an electrically conductive or semiconductive layer which can be used between an anode and an active organic material. A buffer layer is believed to accomplish one or more function in an organic electronic device, including, but not limited to planarization of the underlying layer, hole transport, hole injection, scavenging of impurities, such as oxygen and metal ions, among other aspects to facilitate or to improve the performance of an organic electronic device.

In one embodiment, there are provided buffer layers deposited from aqueous dispersions comprising polypyrroles and colloid-forming polymeric acids. In one embodiment, the buffer layers are deposited from aqueous dispersions comprising colloid-forming polymeric sulfonic acid. In one embodiment, the buffer layer is deposited from an aqueous dispersion containing polypyrrole and fluorinated polymeric acid colloids. In another embodiment, the fluorinated polymeric acid colloids are fluorinated polymeric sulfonic acid colloids. In still another embodiment, the buffer layer is deposited from an aqueous dispersion containing polypyrrole and perfluoroethylenesulfonic acid colloids.

In another embodiment, there are provided buffer layers deposited from aqueous dispersions comprising at least one polypyrrole, at least one colloid-forming polymeric acid, and at least one co-dispersing liquid. In one embodiment, the co-dispersing liquid is selected from n-propanol, isopropanol, t-butanol, methanol dimethylacetamide, dimethylformamide, N-methylpyrrolidone, ethylene glycol, and mixtures thereof.

In another embodiment, there are provided buffer layers deposited from aqueous dispersions comprising at least one polypyrrole and at least one colloid-forming polymeric acids blended with other water soluble or dispersible materials. Depending on the final application of the material, examples of types of additional water soluble or dispersible materials which can be added include, but are not limited to, polymers, dyes, coating aids, carbon nanotubes, metal nanowires and nanoparticles, organic and inorganic conductive inks and pastes, charge transport materials, piezoelectric, pyroelectric, or ferroelectric oxide nano-particles or polymers, photoconductive oxide nanoparticles or polymers, photoconductive polymers, dispersing agents, crosslinking agents, and combinations thereof. The materials can be simple molecules or polymers. Examples of suitable other water soluble or dispersible polymers include, but are not limited to, polyacrylamide, polyvinylalcohol, poly(2-vinylpridine), poly(vinylacetate), poly(vinylmethylether), poly(vinylpyrrolidone), poly (vinylbutyral), poly(styrenesulfonic acid, colloid-forming polymeric acids such as discussed above, and conductive polymers such as polythiophenes, polyanilines, polyamines, polypyrroles, polyacetylenes, and combinations thereof.

In another embodiment, there are provided electronic devices comprising at least one electrically conductive or semiconductive layer made from the new composition. Organic electronic devices that may benefit from having one or more layers comprising the composition of at least one polypyrrole, and at least one colloid-forming polymeric acid include, but are not limited to, (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semiconductor layers (e.g., a transistor or diode). Other uses for the new compositions include coating materials for memory storage devices, antistatic films, biosensors, electrochromic devices, solid electrolyte capacitors, energy storage devices such as rechargeable battery, and electromagnetic shielding applications.

In one embodiment, the dried layers of polypyrroles and polymeric acid colloids, such as fluorinated polymeric sulfonic acid colloids, are not redispersible in water. In one embodiment, an organic device comprising at least one layer comprising the new composition is made of multiple thin layers. In one embodiment, the layer can be further overcoated with a layer of different water-soluble or water-dispersible material without substantial damage to the layer's functionality or performance in an organic electronic device.

In one embodiment, the organic electronic device comprises an electroactive layer positioned between two electrical contact layers, wherein at least one of the layers of the device includes the new buffer layer. One embodiment is illustrated in one type of OLED device, as shown in FIG. 1, which is a device that has anode layer 110, a buffer layer 120, an electroluminescent layer 130, and a cathode layer 150. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline, polythiophene, or polypyrrole.

The IUPAC number system is used throughout, where the groups from the Periodic Table are numbered from left to right as 1-18 (CRC Handbook of Chemistry and Physics, $81^{st}$ Edition, 2000).

The anode layer 110 may be formed by a chemical or physical vapor deposition process or spin-coating process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 is deposited onto substrates using any technique well-known to those skilled in the art.

The electroluminescent (EL) layer 130 may typically be any organic EL material, including, but not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

The particular material chosen may depend on the specific application, potentials used during operation, or other factors. The EL layer 130 containing the electroluminescent organic material can be applied using any number of techniques including vapor deposition, solution processing techniques or thermal transfer. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal-chelated oxinoid compounds (e.g., Alq$_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. In one embodiment, inorganic anode layer 110 is usually no greater than approximately 500 nm, for example, approximately 10-200 nm; buffer layer 120, is usually no greater than approximately 250 nm, for example, approximately 50-200 nm; EL layer 130, is usually no greater than approximately 100 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm.

Depending upon the application of the electronic device, the EL layer 130 can be a light-emitting layer that is activated by signal (such as in a light-emitting diode) or a layer of material that responds to radiant energy and generates a signal with or without an applied potential (such as detectors or voltaic cells). Examples of electronic devices that may respond to radiant energy are selected from photoconductive cells, photoresistors, photoswitches, biosensors, phototransistors, and phototubes, and photovoltaic cells. After reading this specification, skilled artisans will be capable of selecting material(s) that are suitable for their particular applications. The light-emitting materials may be dispersed in a matrix of another material, with or without additives, or form a layer alone. The EL layer 130 generally has a thickness in the range of approximately 50-500 nm. In one embodiment, EL layer 130 is less than approximately 200 nm.

In organic light emitting diodes (OLEDs), electrons and holes, injected from the cathode 150 and anode 110 layers, respectively, into the EL layer 130, form negative and positively charged polarons in the polymer. These polarons migrate under the influence of the applied electric field, forming a polaron exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

OLEDs provided with buffer layers deposited from aqueous dispersions comprising polymeric pyrrole and colloid-forming polymeric acids have been found to have improved performance. The buffer layer may be deposited from an aqueous dispersion of polypyrrole and fluorinated polymeric sulfonic acid colloids; and in one embodiment the aqueous dispersion is one in which the pH has been adjusted to above about 3.5.

Using a less acidic or pH neutral material leads to significantly less etching of the ITO layer during device fabrication and hence much lower concentration of In and Sn ions diffusing into the polymer layers of the OLED. Since In and Sn ions are suspected to contribute to reduced operating lifetime this is a significant benefit.

The lower acidity also reduces corrosion of the metal components of the display (e.g. electrical contact pads) during fabrication and over the long-term storage. Acid residues in the buffer layer will interact with residual moisture to release acid into the displays with resulting slow corrosion.

The buffer layers comprising the new compositions have lower moisture uptake and thus less water is included in the device fabrication process. This lower moisture level can also result in better operating lifetime for the device and reduced corrosion.

Equipment used to dispense the acidic buffer layers needs to be specially designed to handle the strong acidity. For example, a chrome-plated slot-die coating-head used to coat a buffer layer of acidic PANI/PSSA onto ITO substrates was found to be corroding due to the acidity of the PANI/PSSA. This rendered the head unusable since the coated film became contaminated with particles of chrome. Similar problems would be expected to occur with acidic polypyrrole buffer layers. Also, certain ink-jet print heads are of interest for the fabrication of OLED displays. They are used for dispensing both the buffer layer and the light-emitting polymer layer in precise locations on the display. These print-heads contain nickel mesh filters as an internal trap for particles in the ink. These nickel filters are decomposed by acidic materials and rendered unusable. Neither of these corrosion problems will occur with the aqueous polypyrrole dispersions of the new compositions in which the acidity has been lowered.

Furthermore, certain light-emitting polymers are found to be sensitive to acidic conditions, and their light-emitting capability is degraded if they are in contact with an acidic buffer layer. It is advantageous to use the aqueous polypyrrole dispersions of the new compositions to form the buffer layer because of the lower acidity or neutrality.

The fabrication of full-color or area-color displays using two or more different light-emitting materials becomes complicated if each light-emitting material requires a different cathode material to optimize its performance. Display devices are made up of a multiplicity of pixels which emit light. In multicolor devices there are at least two different types of pixels (sometimes referred to as sub-pixels) emitting light of different colors. The sub-pixels are constructed with different light-emitting materials. It is very desirable to have a single cathode material that gives good device performance with all of the light emitters. This minimizes the complexity of the device fabrication. In multicolor devices where the buffer layer is made from the aqueous polypyrrole dispersions of the invention, it may be possible to use a common cathode while maintaining good device performance for each of the colors. The cathode can be made from any of the materials discussed above; and may be barium, overcoated with a more inert metal such as aluminum.

Other organic electronic devices that may benefit from having one or more layers comprising the aqueous dispersion of polypyrrole and at least one colloid-forming polyermic acids include (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode). Other uses for the new compositions include coating materials for memory storage devices, antistatic films, biosensors, electrochromic devices, and electromagnetic shielding.

The buffer layer, or the electrically conductive or electrically semiconductive layer, can further be overcoated with a layer of conductive polymer applied from aqueous solution or solvent. The conductive polymer can facilitate charge transfer and also improve coatability. Examples of suitable conductive polymers include, but are not limited to, polyanilines, polythiophenes, polyanilin/polymeric-acid-colloids such as those disclosed in co-pending application Ser. No. 10/669,577, polythiophene/polymeric-acid-colloids such as those disclosed in co-pending application Ser. No. 10/669,494, or polythiophene/polystyrenesulfonic acid, polypyrroles, polyacetylenes, and combinations thereof.

The composition comprising such a layer may further comprise conductive polymers, and may also comprise dyes, carbon nanotubes, carbon nanoparticles, metal nanowires, metal nanoparticles, carbon fibers and particles, graphite fibers and particles, coating aids, organic and inorganic conductive inks and pastes, charge transport materials, semiconductive or insulating inorganic oxide particles, piezoelectric, pyroelectric, or ferroelectric oxide nano-particles or polymers, photoconductive oxide nanoparticles or polymers, photoconductive polymers, dispersing agents, crosslinking agents and combinations thereof. These materials can be added to the new composition either before or after polymerization of the monomer and/or before or after treatment with at least one ion exchange resin.

In yet another embodiment of the invention, there are provided thin film field effect transistors comprising electrodes comprising polypyrrole and colloid-forming polymeric sulfonic acids. For use as electrodes in thin film field effect transistors, the conducting polymers and the liquids for dispersing the conducting polymers must be compatible with the semiconducting polymers and the solvents for the semiconducting polymers to avoid re-dissolution of either conducting polymers or semiconducting polymers. Thin film field effect transistor electrodes fabricated from conducting polymers should have a conductivity greater than 10 S/cm. However, electrically conducting polymers made with water soluble polymeric acids only provide conductivity in the range of $\sim 10^{-2}$ S/cm or lower. Thus, in one embodiment, the electrodes comprise polypyrrole and fluorinated colloid-forming polymeric sulfonic acids in combination with electrical conductivity enhancers such as metal nanowires and nanoparticles, carbon nanotubes, or the like. In still another embodiment, the electrodes comprise polypyrrole and colloid-forming perfluoroethylenesulfonic acid in combination with electrical conductivity enhancers such as metal nanowires and nanoparticles, carbon nanotubes, or the like. Invention compositions may be used in thin film field effect transistors as gate electrodes, drain electrodes, or source electrodes.

Figure 2:
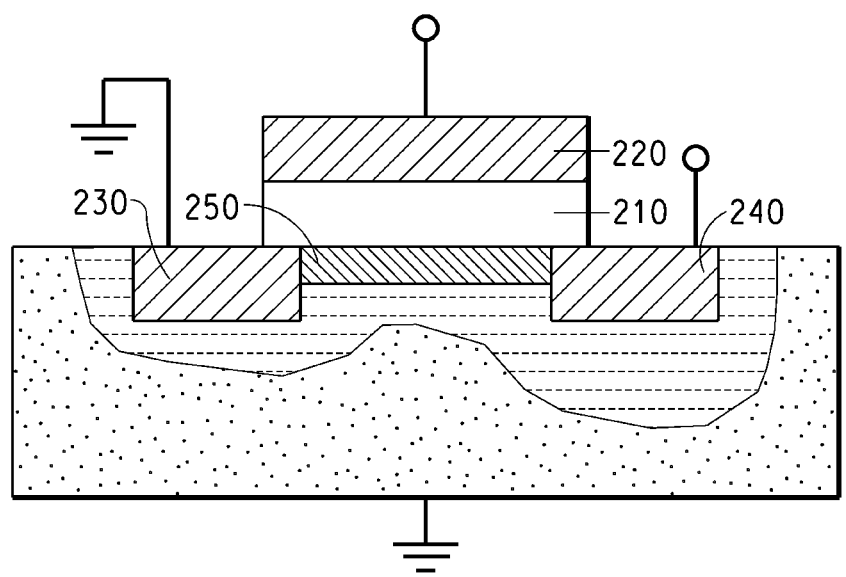
FIG. 2 illustrates a cross-sectional view of a thin film field effect transistor that comprises an electrode comprising one embodiment of the new composition.

Thin film field effect transistors, as shown in FIG. 2, are typically fabricated in the following manner. A dielectric polymer or dielectric oxide thin film 210 has a gate electrode 220 on one side and drain and source electrodes, 230 and 240, respectively, on the other side. Between the drain and source electrode, an organic semiconducting film 250 is deposited. Invention aqueous dispersions containing nanowires or carbon nanotubes are ideal for the applications of gate, drain and source electrodes because of their compatibility with organic based dielectric polymers and semiconducting polymers in solution thin film deposition. Since the new compositions, e.g., polypyrrole and colloidal perfluoroethylene sulfonic acid, exist as a colloidal dispersion, less weight percentage of the conductive fillers is required (relative to compositions containing water soluble polymeric sulfonic acids) to reach percolation threshold for high electrical conductivity.

In another embodiment, there are provided field effect resistance devices comprising one layer comprising at least one polythiophene having Formula I(a) or Formula I(b) and at least one colloid-forming polymeric sulfonic acids. The field effect resistance devices undergo reversible change of resistance in the conducting polymer films when subjected to a pulse of gate voltage as illustrated in pages 339-343, No. 2, 2002, Current Applied Physics.

In another embodiment, there are provided electrochromic displays comprising at least one layer comprising at least one polythiophene having Formula I(a) or Formula I(b) and at least one colloid-forming polymeric sulfonic acids. Electrochromic displays utilize change of color when thin film of the material is subjected to electrical potential. In one embodiment electrically conductive polythiophene/polymeric acid colloids of the new composition are superior materials for this application because of the high pH of the dispersion, and the low moisture uptake and water non-dispersibility of dried solid films made from the dispersions.

In yet another embodiment, there are provided memory storage devices comprising silicon chips top-coated with a composition comprising at least one polythiophene having Formula I(a) or Formula I(b) and at least one colloid-forming polymeric sulfonic acids. For example, a write-once-read-many-times (WORM) memory is known in the arts (Nature, Page 166 to 169, vol 426, 2003). When information is recorded, higher voltages at certain points in the circuit grids of silicon chips destroys the polythiophene at those points to create "zero" bit data. The polythiophene at the untouched points remains electrically conductive and becomes "1" bit data.

In another embodiment of the invention, the aqueous dispersions of polypyrroles having Formula I are used to form coatings for, but not limited to, biosensor, electrochromic, anti-static, solid electrolyte capacitors, or electromagnetic shielding applications.

In still another embodiment of the invention, there are provided methods for producing, aqueous dispersions of polypyrrole comprising polymerizing pyrrole monomers in the presence of polymeric acid colloids. In another embodiment, the colloid-forming polymeric acid is carboxylic acid, acrylic acid, sulfonic acid, phosphoric acid, phosphonic acid, or the like, or combination of above. In one embodiment of the new method for making the new compositions, the polypyrrole is an unsubstituted polypyrrole and the colloid-forming polymeric acid is fluorinated. In another embodiment of the new compositions, the polypyrrole is unsubstituted polypyrrole and the colloid-forming polymeric acid is perfluorinated. In still another embodiment, the colloid-forming acid is polyethylenesulfonic acid. In still another embodiment, the polyethylenesulfonic acid is perfluorinated. The polymerization is carried out in water. In still another embodiment, the perfluoroethylenesulfonic acid containing polymerization is carried out with an additional acid as set forth above. The resulting reaction mixture can be treated with ion exchange resins to remove reaction byproducts and attainment of a desired pH aqueous dispersion. In another embodiment, the pH can be further adjusted with ion exchangers or a basic aqueous solution.

In one embodiment, at least one co-dispersing liquid is added to the reaction mixture prior to termination of the polymerization of the pyrrole monomers. In another embodiment, at least one co-dispersing liquid are added to the reaction mixture after the termination of the polymerization of the pyrrole. In another embodiment, a portion of at least one co-dispersing liquid is added prior to termination of the pyrrole polymerization and an additional quantity of at least one co-dispersing liquid is added after termination of the polymerization of the pyrrole The new compositions, new methods of making and uses will now be described in greater detail by reference to the following non-limiting examples.

EXAMPLES

Example 1

This example illustrates the preparation of an aqueous polypyrrole dispersion, in which the dispersed polypyrrole is made with pyrrole and Nafion®, a colloidal perfluoroethylenesulfonic acid ("PPy/Nafion®").

A 25% (w/w) aqueous colloidal dispersion of perfluoroethylenesulfonic acid with an EW of 1050 was made using a procedure similar to the procedure in U.S. Pat. No. 6,150,426, Example 1, Part 2, except that the temperature was approximately 270° C. The dispersion was diluted with water to form a 12% (w/w) dispersion for the polymerization.

To a 500 mL reaction kettle fitted with an electrically controlled propeller type-stirring paddle were added 64.6 g (7.38 mmoles of Nafion® monomer units) of the Nafion® polymer dispersion, 125 g de-ionized water, 62 mg ferric sulfate (Aldrich, Cat. #307718), and 0.175 mL (2.10 mmoles) 37% (w/w) aqueous hydrochloric acid (Ashland Chemicals, Columbus, Ohio; cat. #3471440) and the reaction mixture stirred at 200 RPM. After 5 minutes of stirring, an addition of 0.253 mL (3.58 mmoles) of freshly distilled pyrrole (Acros Organics, cat. #157711000) resulted in a rapid color change of the reaction mixture from clear to dark green. After another 5 minutes of stirring, a slow injection of an oxidizing solution made of 1.01 g (4.24 mmoles) sodium persulfate (Fluka, cat. #71889) in 10 mL de-ionized water was started at the rate of 1.0 mL/h. This was accomplished by leading a small tube from a 10 mL syringe on an automatic syringe pump into the reaction vessel, with the end of the tube approximately 4" above the reaction mixture. As the oxidizing agent was added to the reaction mixture its color turned from dark green to greenish-brown. Addition of the oxidizing agent solution took about 10 hours to complete. Polymerization and addition of the oxidizing agent solution were all done at ambient temperature. By the end of the addition, particle size count measured with an Accusizer (Model 780A, Particle Sizing Systems, Santa Barbara, Calif.) was 1.2 million particles in each 1 mL of dispersion where the particles are greater than 0.75 µm. The reaction mixture was allowed to proceed for another seven and one half hours before adding 15 g Lewatit Monoplus S100, 15 g Lewatit MP62WS and 20 g n-propanol. Lewatit Monoplus S100 is a trade name from Bayer, Pittsburgh, for sodium sulfonate of crosslinked polystyrene ion exchange resin. Lewatit MP62WS is a trade name from Bayer for tertiary/quaternary amine of crosslinked polystyrene ion exchange resin. The resins were washed deionized water first until there was no color in the water before the use. The reaction mixture containing the resin was stirred for four and one half hours and then filtered through two pieces of Whatman #54 filter paper. Particle size count was 0.75 million particles in each 1 mL of dispersion where the particles were greater than 0.75 µm. The dispersion was very stable without any sign of sedimentation. pH of the dispersion was 5.4 measured with a pH meter, and the conductivity of dried films was $5.4 \times 10^{-6}$ S/cm. A small portion of the dispersion was dried with a flowing stream of nitrogen to form solid films for solid percentage. It was determined to be 4.1%.

Example 2

This example illustrates application of aqueous PPy/Nafion® dispersion for polymeric light emitting diodes.

The aqueous PPy/Nafion® dispersion prepared in Example 1 was used for making light emitting diodes on indium/tin oxide (ITO)/glass substrates. The glass/ITO substrates (30 mm×30 mm) having ITO thickness of 100 to 150 nm and 15 mm×20 mm ITO area for light emission, were cleaned and subsequently treated with UV ozone. The aqueous PPY/Nafion® dispersion was spin-coated onto the ITO/glass substrates for a thickness of 62 nm. The spin-coated films were then baked at 90° C. in vacuum for 30 minutes. For the light-emitting layer, a 1% (w/v) toluene solution of Lumination Green from Dow Chemicals (Midland, Mich.) was spin-coated on top of PPy/Nafion® films and subsequently baked at 130° C. in nitrogen for 30 minutes. Immediately after, 3.0 nm thick barium and 550 nm aluminum were deposited on Lumination Green films to serve as a cathode. The diodes exhibit 1,000 cd/m² luminance and 18 cd/A efficiency at a current density of 5.7 mA/cm² and voltage of 3.4 V.

Example 3

This example illustrates some of the properties of dried solids prepared from aqueous polypyrrole/Nafion® dispersion.

0.418 g of the dried PPy/Nafion® prepared in Example 1 was mixed with 9.6 g of de-ionized water. The water remained clear even after standing for a long time. The result clearly indicated that dry PPy/Nafion® films did not re-disperse in water. The water in contact with the dried PPY/Nafion® had a pH of 6.3, indicating that acid was not leaching out. Moreover, moisture uptake was less than 1% after 24 hours at ambient conditions. These characteristics are important in materials aimed for OLEDs, anti-static coatings, electromagnetic shielding, and microelectronics applications, such as field effect transistors, electrochromic displays, and memory storage.

Comparative Example 3A

This Comparative Example illustrates properties of solid films dried from a commercial aqueous PEDT dispersion made with water soluble poly(styrenesulfonic acid).

About 30 mL of Baytron-P VP AI 4083 (Lot #06Y76982) from H.C. Starck, GmbH (Leverkusen, Germany) was dried to solid films in a glass beaker under a nitrogen flow at room temperature. The dried film flakes were mixed with about 10 mL deionized water and the mixture was shaken by hand. The water turned blue and became very dark as most of the flakes were re-dispersed in the water. The water also became very acidic, having a pH of less than 2, using a pH meter.

Comparative Example 3B

This Comparative Example illustrates moisture uptake of solid films dried from another commercial aqueous PEDT dispersion made with water soluble poly(styrenesulfonic acid):

About 30 mL of Baytron-P CH8000 (Lot #CHN0004) from H.C. Starck, GmbH (Leverkusen, Germany) was dried to solid films in a glass beaker under a nitrogen flow at room temperature. A major portion of the dried films was tested for re-dispersibility and acidity in about 10 mL deionized water and found to behave as described in Comparative Example 3A. A small portion of the dried film flakes was then allowed to equilibrate at ambient conditions before being analyzed for moisture uptake by a thermal gravimetric analyzer (at 20° C./min in nitrogen). The film flakes absorbed 29.4% water at ambient conditions.

These results clearly demonstrate that the PEDT films are very hygroscopic and that any moisture absorbed would become very acidic. Both VP AI 4083 and CH8000 PEDT are marketed for use in OLEDs as buffer layers.

What is claimed is:

1. A composition comprising a stable colloid particle containing composition comprising a continuous liquid aqueous medium having dispersed therein a polypyrrole and at least one colloid-forming polymeric acid, wherein the composition does not re-disperse in an aqueous medium after it has been dried.

2. A composition according to claim 1, wherein said polypyrrole has Formula I below

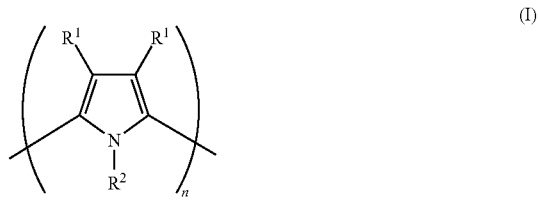

where in Formula I:
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, amidosulfonate, alcohol, benzyl, carboxylate, ether, ether carboxylate, ether sulfonate, and urethane, and may be a homopolymer or co-polymer.

3. A composition according to claim 2, wherein $R^1$ is the same or different at each occurrence and is independently selected from hydrogen, alkyl, alkenyl, alkoxy, cycloalkyl, cycloalkenyl, alcohol, benzyl, carboxylate, ether, ether carboxylate, amidosulfonate, ether sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

4. A composition according to claim 2, wherein $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

5. A composition according to claim 2, wherein $R^1$ and $R^2$ are hydrogen.

6. A composition according to claim 2, wherein both $R^1$ together form a 6- or 7-membered alicyclic ring, which is further substituted with a group selected from alkyl, heteroalkyl, alcohol, benzyl, carboxylate, ether, ether carboxylate, amidosulfonate, ether sulfonate, and urethane.

7. A composition according to claim 2, wherein both $R^1$ together form —O—(CHY)$_m$—O—, where m is 2 or 3, and Y is the same or different at each occurrence and is selected from hydrogen, alkyl, alcohol, benzyl, carboxylate, ether, ether carboxylate, amidosulfonate, ether sulfonate, and urethane.

8. A composition according to claim 1, wherein said colloid-forming polymeric acid is selected from polymeric sulfonic acids, polymeric carboxylic acids, polymeric acrylic acids, polymeric phosphoric acids, polymeric phosphonic acids, and mixtures thereof.

9. A composition according to claim 1, wherein said polymeric acid is a fluorinated polymeric sulfonic acid.

10. A composition according to claim 9, wherein said polymeric sulfonic acid is a perfluoroalkylenesulfonic acid.

11. The composition of claim 1, wherein the composition further comprises at least one selected from a conductive polymer, metal particles, graphite fibers, graphite particles, carbon nanotubes, carbon nanoparticles, metal nanowires, organic conductive inks, organic conductive pastes, inorganic conductive inks, inorganic conductive pastes, charge transport materials, semiconductive inorganic oxide nano-particles, insulating inorganic oxide nano-particles, piezoelectric oxide nano-particles, piezoelectric polymers, pyrroelectric oxide nano-particles, pyrroelectric polymers, ferroelectric oxide nano-particles, ferroelectric polymers, dispersing agents, crosslinking agents and combinations thereof.

12. The composition of claim 1, wherein the composition has a pH of 1 to 8.

13. The composition of claim 1, wherein the colloid-forming polymeric acid includes a highly fluorinated carbon backbone and side chains represented by the formula

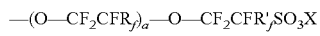

wherein $R_f$ and $R'_f$ are independently selected from F, Cl or a perfluorinated alkyl group having 1 to 10 carbon atoms, a=0, 1 or 2, and X is H.

14. An organic electronic device having at least one active layer made from a stable colloid particle containing composition comprising a continuous liquid aqueous medium having dispersed therein a polypyrrole and at least one colloid-forming polymeric acid, wherein the layer does not re-disperse in an aqueous medium after it has been formed.

15. The device of claim 14, wherein said polypyrrole has Formula I below:

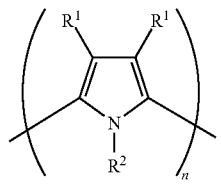

where in Formula I:
R¹ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, and urethane; or both R¹ groups together may form an alkylene or alkenylene chain completing a 3, 4, 5, 6, or 7-membered aromatic or alicyclic ring, which ring may optionally include one or more divalent nitrogen, sulfur or oxygen atoms; and
R² is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, amidosulfonate, alcohol, benzyl, carboxylate, ether, ether carboxylate, ether sulfonate, and urethane, and may be a homopolymer or co-polymer;
and,
wherein said polymeric acid is a fluorinated polymeric sulfonic acid.

* * * * *